US009514209B2

(12) United States Patent
Teng

(10) Patent No.: US 9,514,209 B2
(45) Date of Patent: Dec. 6, 2016

(54) DATA PROCESSING METHOD AND DATA PROCESSING DEVICE

(71) Applicant: HUAWEI TECHNOLOGIES CO., LTD., Shenzhen (CN)

(72) Inventor: Xindong Teng, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 519 days.

(21) Appl. No.: 14/186,226

(22) Filed: Feb. 21, 2014

(65) Prior Publication Data
US 2014/0172795 A1 Jun. 19, 2014

Related U.S. Application Data

(63) Continuation of application No. PCT/CN2013/071725, filed on Feb. 21, 2013.

(30) Foreign Application Priority Data

Mar. 2, 2012 (CN) .......................... 2012 1 0053609

(51) Int. Cl.
G06F 17/30 (2006.01)
H03M 7/30 (2006.01)
H04L 29/06 (2006.01)

(52) U.S. Cl.
CPC .......... G06F 17/30575 (2013.01); H03M 7/30 (2013.01); H03M 7/3091 (2013.01); H03M 7/3095 (2013.01); H04L 69/04 (2013.01)

(58) Field of Classification Search
CPC .................. G06F 17/30156; G06F 17/30159; G06F 17/30575; G06F 3/0608; G06F 3/0641; G06F 3/067
See application file for complete search history.

(56) References Cited

U.S. PATENT DOCUMENTS 6,667,700 B1   12/2003   McCanne et al.
6,842,628 B1 *  1/2005   Arnold .................. H04L 12/587
                                                        455/556.2

(Continued)

FOREIGN PATENT DOCUMENTS

| CN | 1630984 A | 6/2005 |
| CN | 1736030 A | 2/2006 |
| CN | 1901549 A | 1/2007 |
| CN | 101599091 A | 12/2009 |
| CN | 102122959 A | 7/2011 |
| CN | 102684827 A | 9/2012 |
| EP | 1 895 665 A2 | 3/2008 |

OTHER PUBLICATIONS

International Search Report issued May 23, 2013, in corresponding International Patent Application No. PCT/CN2013/071725.

(Continued)

Primary Examiner — Dinku Gebresenbet
(74) Attorney, Agent, or Firm — Staas & Halsey LLP

(57) ABSTRACT

Embodiments of the present invention provide a data processing method and a data processing device. If to-be-compressed data includes a data fragment that is the same as a first half of a variable block in a duplicate database and is different from a second half of the variable block, a new variable block with granularity smaller than that of the matching variable block can be generated, and the new variable block is added to the duplicate database. The granularity of the new variable block is smaller, which increases the probability of subsequent to-be-compressed data matching the updated duplicate database, thereby improving compression efficiency.

27 Claims, 7 Drawing Sheets

(56) References Cited

U.S. PATENT DOCUMENTS

| 7,283,630 | B1* | 10/2007 | Doljack | G06K 17/00 |
| | | | | 235/462.01 |
| 2002/0037035 | A1 | 3/2002 | Singh | 375/240 |
| 2003/0217292 | A1* | 11/2003 | Steiger | H04L 63/126 |
| | | | | 726/3 |
| 2005/0162288 | A1 | 7/2005 | McCanne et al. | 341/51 |
| 2010/0211794 | A1* | 8/2010 | Bilobrov | G06K 9/00067 |
| | | | | 713/176 |
| 2012/0016882 | A1 | 1/2012 | Tofano | |

OTHER PUBLICATIONS

Extended European Search Report dated Jan. 20, 2015 in corresponding European Patent Application No. 13754635.4.
Artis, "z/OS Data De-De-De-De-duplication", zJournal, Jun. 14, 2010, pp. 1-12.
Moh et al., "A Running Time Improvement for the Two Thresholds Two Divisors Algorithm", ACMSE '10, Apr. 15-17, 2010, Oxford, MS, USA, 6 pp.
Salomon, "Data Compression: The Complete Reference"—"Dictionary Methods" excerpt, Jan. 1998, pp. 101-162, 357-360.
Pan Zhi-Gang et al., "A Wavelet Based Algorithm for SAR Raw Data Compression", *Journal of Electronics & Information Technology*, Oct. 2006, pp. 1798-1801, vol. 28, No. 10, Chinese Academy of Sciences, Beijing, China.
Chinese Office Action issued May 9, 2014, in corresponding Chinese Patent Application No. 201210053609.6.
Communication pursuant to Article 94(3) of EPC, dated Jul. 6, 2016, in corresponding European Patent Application No. 13754635.4 (6 pp.).
Denehy, Timothy E. et al., *IBM Research Report, Duplicate Management for Reference Data*, RJ 10305 (A0310-017) Oct. 7, 2003, pp. 1-14.
International Search Report mailed May 23, 2013 in corresponding International Patent Application No. PCT/CN2013/071725.

\* cited by examiner

| According to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same | 11 |

| Search a first local duplicate database for the first fingerprint, where the first local duplicate database is used to store duplicate data, a fingerprint of the duplicate data, and a digest of the duplicate data | 12 |

| If the first fingerprint exists in the first local duplicate database, according to the first fingerprint, obtain a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm | 13 |

| According to the digest algorithm, calculate a digest of a second fragment in the to-be-compressed data, where a starting position of the second fragment and the starting position of the to-be-compressed data are the same, and a length of the second fragment and a length of the first variable block are the same | 14 |

| Compare the digest of the second fragment with the digest of the first variable block | 15 |

| If the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block | 16 |

| Add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm | 17 |

FIG. 1

DATA PROCESSING METHOD AND DATA PROCESSING DEVICE

CROSS-REFERENCE TO RELATED APPLICATIONS

This application is a continuation of International Application No. PCT/CN2013/071725, filed on Feb. 21, 2013, which claims priority to Chinese Patent Application No. 201210053609.6, filed on Mar. 2, 2012, both of which are hereby incorporated by reference in their entireties.

TECHNICAL FIELD

Embodiments of the present invention relate to a packet processing technology, and in particular, to a data processing method and a data processing device.

BACKGROUND

Data compression refers to a process in which algorithmic processing is performed on packet content, data amount is decreased, but information transfer is not affected. The data compression is for the purposes of conserving network transmission bandwidth and realizing application acceleration.

According to a CDC (Content-Defined Chunking) variable block algorithm, a duplicate database including a variable block, a fingerprint of the variable block, and a digest of the variable block is generated. After the duplicate database is generated, if to-be-compressed data includes a data fragment being the same as a first half of the variable block and being different from a second half of the variable block, a fingerprint of the data fragment and the fingerprint of the variable block match, and a digest of the data fragment and the digest of the variable block do not match. The CDC algorithm regards that the duplicate database needs to be updated, and uses a delimitation sliding window mechanism to generate a new variable block. Granularity of the new variable block may be large, which decreases the probability of subsequent to-be-compressed data matching the updated duplicate database. The above may incur decrease of compression efficiency.

SUMMARY

Embodiments of the present invention provide a data processing method and a data processing device, so as to improve data compression efficiency.

In one aspect, an embodiment of the present invention provides a data processing method, which includes:

according to a fingerprint algorithm, calculating a first fingerprint of a first fragment in to-be-compressed data, where a starting position of the first fragment and a starting position of the to-be-compressed data are the same, and a length of the first fragment and a length of a first sliding window are the same;

searching a first local duplicate database for the first fingerprint, where the first local duplicate database is used to store duplicate data, a fingerprint of the duplicate data, and a digest of the duplicate data;

if the first fingerprint exists in the first local duplicate database, according to the first fingerprint, obtaining a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm;

according to the digest algorithm, calculating a digest of a second fragment in the to-be-compressed data, where a starting position of the second fragment and the starting position of the to-be-compressed data are the same, and a length of the second fragment and a length of the first variable block are the same;

comparing the digest of the second fragment with the digest of the first variable block;

if the digest of the second fragment and the digest of the first variable block are different, obtaining a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and adding the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

In another aspect, an embodiment of the present invention further provides a data compression device, which includes:

a first fingerprint calculating unit, configured to, according to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same;

a searching unit, configured to search a first local duplicate database for the first fingerprint, where the first local duplicate database is used to store duplicate data, a fingerprint of the duplicate data, and a digest of the duplicate data;

a duplicate content obtaining unit, configured to, if the first fingerprint exists in the first local duplicate database, according to the first fingerprint, obtain a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm;

a digest calculating unit, configured to, according to the digest algorithm, calculate a digest of a second fragment in the to-be-compressed data, where a starting position of the second fragment and the starting position of the to-becompressed data are the same, and a length of the second fragment and a length of the first variable block are the same;

a digest comparing unit, configured to compare the digest of the second fragment with the digest of the first variable block;

a first sub-fragment obtaining unit, configured to, if the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and a first adding unit, configured to add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

In another aspect, an embodiment of the present invention further provides a data decompression device, which includes:

a first fingerprint calculating unit, configured to, according to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same;

a searching unit, configured to search a first local duplicate database for the first fingerprint, where the first local duplicate database is used to store duplicate data, a fingerprint of the duplicate data, and a digest of the duplicate data;

a duplicate content obtaining unit, configured to, if the first fingerprint exists in the first local duplicate database, according to the first fingerprint, obtain a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm;

a digest calculating unit, configured to, according to the digest algorithm, calculate a digest of a second fragment in the to-be-compressed data, where a starting position of the second fragment and the starting position of the to-be-compressed data are the same, and a length of the second fragment and a length of the first variable block are the same;

a digest comparing unit, configured to compare the digest of the second fragment with the digest of the first variable block;

a first sub-fragment obtaining unit, configured to, if the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and a first adding unit, configured to add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

According to the technical solutions provided by the embodiments of the present invention, if to-be-compressed data includes a data fragment that is the same as a first half of a variable block in a duplicate database and is different from a second half of the variable block, a new variable block with granularity smaller than that of the matching variable block can be generated, and the new variable block is added to the duplicate database. The granularity of the new variable block is smaller, which increases the probability of subsequent to-be-compressed data matching the updated duplicate database, thereby improving compression efficiency.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 1 is a flow chart of a data processing method provided by an embodiment of the present invention;

DESCRIPTION OF EMBODIMENTS

Figure 2:
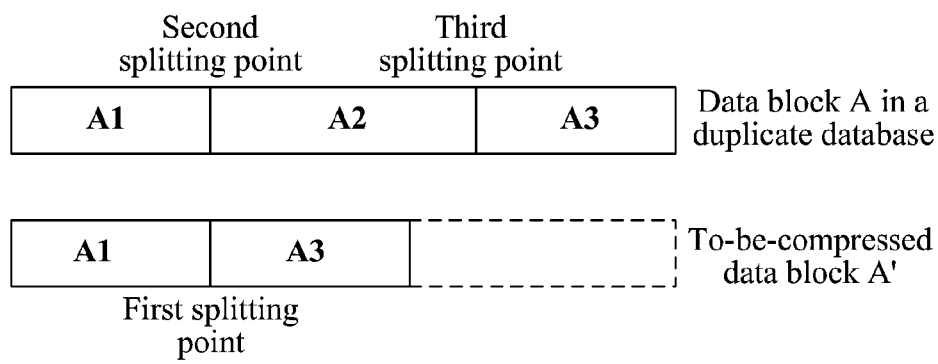
FIG. 2 is a schematic diagram of an application scenario of a data processing method provided by an embodiment of the present invention.

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Data compression technologies include two kinds. One kind is that, data is compressed at a sender through a lossless compression algorithm, and data decompression is performed at a receiver. The other kind is based on a DRE (Data Redundancy Elimination, data redundancy elimination) technology, also called data de-duplication (De-duplication), where duplicate content in data required to be transmitted is eliminated and replaced by a special ID, and only incremental information is transferred, so as to decrease data amount, thereby realizing the purpose of data compression.

The DRE technology is generally applied to a WOC (WAN Optimization Controller, WAN optimization controller), so as to reduce data amount required to be transmitted by a WAN, which is equivalent to increase of WAN bandwidth and conserves precious WAN resources. The WOC is an application acceleration device. In DRE implementation of the WOC device, an object processed may be based on an IP packet, and may also be based on a session (that is, multiple consecutive IP packets of a same session). IP packet based processing is easy to be implemented, does not need packet caching, and has high performance; however, because duplicate data may be included in multiple packets, it is not easy to identify and cache the duplicate data. Further, when multiple packets are combined to perform algorithmic compression, because types of different packets are different (for example, different protocols or different formats), it is difficult to achieve a larger compression ratio. Session based processing needs to cache multiple packets of a session, has limited performance during online processing, but can maximally identity duplicate data; further, a same session normally belongs to a same type, and a larger compression ratio can be achieved during algorithmic compression.

A process of DRE implementation includes: analyzing, by a local DRE module of a compression device, a packet, and judging and determining a corresponding data block; comparing the determined data block with a stored data block in a duplicate database, where if a block being the same is found, it indicates that the data block is transmitted before (that is, duplicate data), and in this case a fingerprint is used to replace the data block in the packet; adding the data block not found to the duplicate database; optionally, further performing compression on the packet with redundancy removed; after decompression (optional), replacing, by a DRE module of a remote device, the fingerprint with the original data block, and then transmitting the packet to a user; where the local DRE module and the remote DRE module need to perform synchronization of the data block and the fingerprint.

The DRE technology performs de-duplication processing based on binary data, and does not need to perceive a specific protocol type of an upper layer. The key is to perform identification and replacement of duplicate data, that is, to identify duplicate data with content being completely the same, and establish a duplicate database (including caching the duplicate data and establishing a searching fingerprint), and when subsequently transmitted data has cached content (that is, the duplicate data), the fingerprint is used for replacement. Because the duplicate database needs to be established to cache existing data, the DRE technology is also called a byte cache (Byte cache) technology.

Identification and replacement of duplicate data is implemented based on a data block, and an identification algorithm of the data block includes FSP (Fixed-Sized Partition, fixed-sized partition), CDC, and SB (Sliding Block, sliding block).

A CDC algorithm adopts a sliding window (called sliding window for short below) to perform block delimitation on to-be-compressed data, the sliding window moves backwards byte by byte from the data, and a specific Hash (HASH) algorithm (such as rabin HASH and ELF HASH) is adopted to calculate fingerprint information of the sliding window. When a calculated fingerprint satisfies a certain condition (for example, a mod result of a specific value is a certain set value), it is regarded that a boundary of a data block is founded, then the sliding window is slid backwards, fingerprint information of the sliding window is calculated again, and when a calculation condition is satisfied, a boundary of a next data block is found, so as to divide the whole data into multiple size-variable data blocks.

After the data block is determined, the content of the data block is calculated by using a specific algorithm (such as SHA-1 and MD5, where the algorithms can perform information extraction on a large amount of data to form a field of a fixed length, and because the algorithm is specific, the probability that calculation results of different original data are the same is very low and can be ignored), a calculation result is used as a fingerprint to search a local duplicate database; if the fingerprint exists, it indicates that a data block of the same content already exists, and the current data block is a duplicate data block; if the fingerprint does not exist, the fingerprint and the block content of the current data block are added to a cache (the duplicate database), so as to be used in a next check.

A block delimitation algorithm of the CDC algorithm may cause a block to be too large because a calculation condition always fails to be satisfied. In specific implementation, upper and lower limits may be set to the size of the block, and when a condition of the upper or lower limit is satisfied, chunking is performed in a forced manner. An advantage of the CDC algorithm is that it is insensitive to change of data content, and when data is inserted or deleted, only a small number of data blocks related to the changed data are affected, but the other blocks are not affected.

FIG. 1 is a flow chart of a data processing method provided by an embodiment of the present invention. As shown in FIG. 1, the data processing method includes the following steps.

11: According to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same.

The first sliding window is an existing sliding window, and is configured to perform delimitation on a data block.

12: Search a first local duplicate database for the first fingerprint, where the first local duplicate database is used to store duplicate data, a fingerprint of the duplicate data, and a digest of the duplicate data.

13: If the first fingerprint exists in the first local duplicate database, according to the first fingerprint, obtain a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm.

14: According to the digest algorithm, calculate a digest of a second fragment in the to-be-compressed data, where a starting position of the second fragment and the starting position of the to-be-compressed data are the same, and a length of the second fragment and a length of the first variable block are the same.

The second fragment is a basic unit-data block undergoing matching and compression processing in an existing CDC algorithm.

15: Compare the digest of the second fragment with the digest of the first variable block.

16: If the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block.

17: Add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

According to the technical solutions provided by the embodiment of the present invention, if to-be-compressed data includes a data fragment that is the same as a first half of a variable block in a duplicate database and is different from a second half of the variable block, a new variable block with granularity smaller than that of the matching variable block can be generated, and the new variable block is added to the duplicate database. The granularity of the new variable block is smaller, which increases the probability of subsequent to-be-compressed data matching the updated duplicate database, thereby improving compression efficiency.

Aforementioned 11 to 17 may be executed by a compression side device, and may also be executed by a decompression device. For example, a compression side device receives a packet with redundancy to be removed, the packet includes a packet header and a payload, the payload is to-be-compressed data, and the compression side device performs processing on the payload according to aforementioned 11 to 17. Alternatively, for example, a decompression side device receives a packet with redundancy removed, similarly the packet with redundancy removed includes a packet header and a payload, but the payload is data compressed by a compression side device, that is, partial data is replaced with a fingerprint, and in this case, to-be-compressed data processed by the decompression side device is the remaining original data, which is not replaced, in the payload.

When the aforementioned method is implemented by a compression side device, the data processing method provided by the embodiment of the present invention may further include:

receiving a first packet, where the first packet includes a first packet header and a first payload, the first payload includes a first payload fragment, and a length of the first payload fragment and a length of the first sub-fragment are the same;

according to the fingerprint algorithm, calculating a fingerprint of a second initial block in the first payload fragment, where a starting position of the second initial block and a starting position of the first payload fragment are the same, and a length of the second initial block and the length of the first sliding window are the same;

according to the digest algorithm, calculating a digest of the first payload fragment; and if the fingerprint of the second initial block is equal to the fingerprint of the first sub-fragment in the second local duplicate database, and the digest of the first payload fragment and the digest of the first sub-fragment are equal, deleting the first payload fragment from the first packet to generate a second packet, where the second packet includes a second packet header and a second payload, the second packet header and the first packet header are the same, and the second payload includes the fingerprint of the first sub-fragment; in this way, the decompression side device may find the corresponding first sub-fragment in the duplicate database according to the fingerprint, replace the fingerprint with the first sub-fragment, and restore the data in the packet to the original data, thereby realizing data decompression.

Optionally, the second payload further includes position information of the first sub-fragment in the first packet.

When the fingerprint replacing the first sub-fragment is not placed in the original position of the first sub-fragment in the first packet, and when the decompression side device executes a decompression operation on the second packet, the decompression side device may determine, according to the position information, included in the second payload, of the first sub-fragment in the first packet, the original position of the first sub-fragment in the first packet, so as to restore the first packet. The position information of the first sub-fragment in the first packet may be an offset of a highest bit of the first sub-fragment relative to a highest bit of the packet header of the first packet.

After obtaining the first sub-fragment in the second fragment, the data processing method provided by the embodiment of the present invention may further include:

according to the fingerprint algorithm, calculating a fingerprint of a third initial block of a second sub-fragment in the to-be-compressed data, where a starting position of the second sub-fragment is the second bit, an end position of the second sub-fragment and an end position of the to-be-compressed data are the same; a starting position of the third initial block is the second bit, and a length of the third initial block is equal to the length of the first sliding window;

according to a second sliding window, obtaining a first detected block in a second sub-variable block, where a starting position of the second sliding window corresponds to a third bit in the second sub-variable block, the third bit is a bit between a starting position of the second sub-variable block and an end position of the second sub-variable block, a length of the second sliding window is equal to the length of the first sliding window, the starting position of the second sub-variable block is the first bit, and the end position of the second sub-variable block and an end position of the first variable block are the same; the second sliding window may be defined as a content sliding window, and is dedicated to determining whether a corresponding data block exists in the duplicate database; the method for calculating a fingerprint may be the same as that of an existing sliding window, but the sliding window in the prior art is only used for delimitation;

according to the fingerprint algorithm, calculating a fingerprint of the first detected block;

comparing the fingerprint of the third initial block with the fingerprint of the first detected block;

if the fingerprint of the third initial block and the fingerprint of the first detected block are the same, comparing a digest of a third sub-variable block in the second sub-variable block with a digest of a third sub-fragment in the second sub-fragment, where a starting position of the third sub-variable block and a starting position of the first detected block are the same, an end position of the third sub-variable block and the end position of the first variable block are the same, a starting position of the third sub-fragment and the starting position of the second sub-fragment are the same, a length of the third sub-fragment and a length of the third sub-variable block are equal, and the digest of the third sub-variable block is obtained by calculating the digest of the third sub-variable block according to the digest algorithm; and if the digest of the third sub-fragment and the digest of the third sub-variable block are equal, adding the third sub-fragment, a fingerprint of the third sub-fragment, and the digest of the third sub-fragment to the second local duplicate database to generate a third local duplicate database, where the fingerprint of the third sub-fragment is equal to the fingerprint of the third initial block, and the digest of the third sub-fragment is obtained by calculating the digest of the third sub-fragment according to the digest algorithm.

In a scenario where the digest of the third sub-fragment and the digest of the third sub-variable block are equal and the third sub-fragment, the fingerprint of the third sub-fragment and the digest of the third sub-fragment are added to the second local duplicate database, the data processing method provided by the embodiment of the present invention may further include:

receiving a third packet, where the third packet includes a third packet header and a third payload, the third payload includes a second payload fragment and a third payload fragment, a length of the second payload fragment and the length of the first sub-fragment are the same, and a length of the third payload fragment and the length of the third sub-fragment are the same;

according to the fingerprint algorithm, calculating a fingerprint of a fourth initial block in the second payload fragment, and according to the fingerprint algorithm, calculating a fingerprint of a fifth initial block in the third payload fragment, where a starting position of the fourth initial block and a starting position of the second payload fragment are the same, a length of the fourth initial block and the length of the first sliding window are the same, a starting position of the fifth initial block and a starting position of the third payload fragment are the same, and a length of the fifth initial block and the length of the first sliding window are the same;

according to the digest algorithm, calculating a digest of the second payload fragment, and according to the digest algorithm, calculating a digest of the third payload fragment; and if a fingerprint of the fourth initial block and the fingerprint of the first sub-fragment in the third local duplicate database are equal, and the digest of the second payload fragment and the digest of the first sub-fragment are equal, deleting the second payload fragment from the third packet; if a fingerprint of the fifth initial block and the fingerprint of the third sub-fragment in the third local duplicate database are equal, and the digest of the third payload fragment and the digest of the third sub-fragment are equal, deleting the third payload fragment from the third packet to generate a fourth packet, where the fourth packet includes a fourth packet header and a fourth payload, the fourth packet header and the third packet header are the same, and the fourth payload includes the fingerprint of the first sub-fragment and the fingerprint of the third sub-fragment.

Optionally, the fourth payload further includes position information of the first sub-fragment in the third packet and position information of the third sub-fragment in the third packet.

The third sub-fragment, similar to the first sub-fragment, is a data block with smaller granularity than the second fragment, so as to further improve data compression efficiency. The position information of the first sub-fragment in the third packet may be an offset of the highest bit of the first sub-fragment relative to a highest bit of the packet header of the third packet.

As shown in FIG. 2, a digest of a to-be-compressed data block A' is different from a digest of a corresponding data block A in a duplicate database, which may be understood as that the data block A sent previously is modified and changes into the data block A', and is sent again. The to-be-compressed data block A' is the aforementioned second fragment, and the corresponding data block A in the duplicate database is the aforementioned first variable block. In this way, the data block A stored in the duplicate database when data is sent previously corresponds to the data block A' in data currently sent. Specifically, when a sliding window slides to the data block A', a fingerprint is calculated; if a same fingerprint exists in the duplicate database, it indicates that a corresponding data block exists in the duplicate database, where the corresponding data block is A. Because a length of the data block A' is unknown at the moment, it is assumed that the length of the data block A' and that of the data block A are the same, and a digest of the data block A' is calculated, and is compared with a digest of the data block A. Obviously, the digest of the data block A' and the digest of the data block A are different, because the content of the data block A and the content of the data block A' are different.

Then, a part in the data block A' being the same as a part in the data block A, and a part in the data block A' being different from a part in the data block A are found, and further compression processing is performed.

Specifically, the data block A' is compared with the data block A byte by byte; when the corresponding data block A in the duplicate database reaches a second splitting point, and the to-be-compressed data block A' reaches a first splitting point, a comparison result of the two indicates inconsistency. In this case, a sliding window is slid to the first splitting point to calculate a fingerprint, and in the duplicate database, a sliding window is slid to the second splitting point to calculate a fingerprint, which is compared with the fingerprint at the first splitting point; if the two fingerprints are inconsistent, the sliding window continues to be slid backwards, a fingerprint behind the second splitting point is calculated, and continues to be compared with the fingerprint at the first splitting point; if the two fingerprints are inconsistent, the sliding window continues to be slid backwards until a calculated fingerprint is consistent with the fingerprint at the first splitting point or until the sliding window slides to an end boundary of the data block A. In this embodiment, a fingerprint at a third splitting point of the data block A and the fingerprint at the first splitting point of the to-be-compressed data block A' are consistent. When the fingerprint at the third splitting point of the data block A and the fingerprint at the first splitting point of the to-be-compressed data block A' are consistent, a length from the first splitting point to a boundary in the to-be-compressed data block A' is calculated by using a block length in a HASH table entry and a length from the third splitting point to the boundary, then a digest from the first splitting point to the boundary is calculated, a digest from the third splitting point to a boundary of the data block A in the duplicate database is calculated, and the two calculated digests are compared; when the two calculated digests are inconsistent, according to the aforementioned operation, a byte behind the third splitting point and a byte behind the first splitting point are compared until a calculated fingerprint and the fingerprint at the first splitting point are consistent or until the sliding window slides to the end boundary of the data block A; when the two calculated digests are consistent, the to-be-compressed data block A' is split into two sub-data blocks A1 and A2 by the first splitting point, and the data block A in the duplicate database is split into three sub-data blocks A1, A2 and A3 by the second splitting point and the third splitting point. It can be seen that, for the currently sent data block A', compared with the previously sent data block A, the sub-data block A2 is deleted, and the other two sub-data blocks A1 and A3 are unchanged, so that A1 or A3 may be replaced with a fingerprint, so as to realize precise compression of data, thereby increasing data compression efficiency. The sub-data block A1 in the to-be-compressed data block A' is the aforementioned first sub-fragment, and the sub-data block A3 in the to-be-compressed data block A' is the third sub-fragment. The sub-data block A1 in the duplicate database is the aforementioned first sub-variable block. An initial block of the sub-data block A3 in the duplicate database is a data block that starts from a first bit of the sub-data block A3 in the duplicate database and has a length of the first sliding window, that is, the first detected block in the second sub-variable block.

Replacing A1 or A3 may also be implemented by using other methods. For example, A1 or A3 may be replaced by using a fingerprint, a block length, and an offset value.

Optionally, the data processing method provided by the embodiment of the present invention may further include:

according to the fingerprint algorithm, calculating a fingerprint of a sixth initial block of a fourth sub-variable block in the first variable block, where a starting position of the fourth sub-variable block is the first bit, an end position of the fourth sub-variable block and the end position of the first variable block are the same, a starting position of the sixth initial block is the first bit, and a length of the sixth initial block is equal to the length of the first sliding window;

obtaining a second detected block in a fourth sub-fragment, where a starting position of the second detected block corresponds to a fourth bit in the fourth sub-fragment, the fourth bit is a bit between a starting position of a third fragment and an end position of the third fragment, a length of the second detected block is equal to the length of the first sliding window, a starting position of the third fragment is the second bit, an end position of the third fragment is determined through a delimitation algorithm, the third fragment is a fragment in the to-be-compressed data, the fourth sub-fragment is a sub-fragment in the third fragment, a starting position of the fourth sub-fragment and the starting position of the second detected block are the same, and a length of the fourth sub-fragment and a length of the fourth sub-variable block are the same;

according to the fingerprint algorithm, calculating a fingerprint of the second detected block;

comparing the fingerprint of the sixth initial block with the fingerprint of the second detected block;

if the fingerprint of the sixth initial block and the fingerprint of the second detected block are the same, comparing a digest of the fourth sub-variable block and a digest of the fourth sub-fragment, where the digest of the fourth sub-variable block is obtained by calculating the digest of the fourth sub-variable block according to the digest algorithm, and the digest of the fourth sub-fragment is obtained by calculating the digest of the fourth sub-fragment according to the digest algorithm; and if the digest of the fourth sub-fragment and the digest of the fourth sub-variable block are the same, adding the fourth sub-fragment, a fingerprint of the fourth sub-fragment, and the digest of the fourth sub-fragment to the second local duplicate database to generate a fourth local duplicate database, where the fingerprint of the fourth sub-fragment and the fingerprint of the sixth initial block are the same.

Optionally, in a scenario where the digest of the fourth sub-fragment and the digest of the fourth sub-variable block are the same and the fourth sub-fragment, the fingerprint of the fourth sub-fragment and the digest of the fourth sub-fragment are added to the second local duplicate database, the data processing method provided by the embodiment of the present invention may further include:

receiving a fifth packet, where the fifth packet includes a fifth packet header and a fifth payload, the fifth payload includes a fourth payload fragment and a fifth payload fragment, a length of the fourth payload fragment and the length of the first sub-fragment are the same, a length of the fifth payload fragment and the length of the fourth sub-fragment are the same;

according to the fingerprint algorithm, calculating a fingerprint of a seventh initial block in the fourth payload fragment, and according to the fingerprint algorithm, calculating a fingerprint of an eighth initial block in the fifth payload fragment, where a starting position of the seventh initial block and a starting position of the fourth payload fragment are the same, a length of the seventh initial block and the length of the first sliding window are the same, a starting position of the eighth initial block and a starting position of the fifth payload fragment are the same, and a length of the eighth initial block and the length of the first sliding window are the same;

according to the digest algorithm, calculating a digest of the fourth payload fragment, and according to the digest algorithm, calculating a digest of the fifth payload fragment; and if the fingerprint of the seventh initial block and the fingerprint of the first sub-fragment in the fourth local duplicate database are equal, and the digest of the fourth payload fragment and the digest of the first sub-fragment are equal, deleting the fourth payload fragment from the fifth packet; if the fingerprint of the eighth initial block and the fingerprint of the fourth sub-fragment in the fourth local duplicate database are equal, and the digest of the fifth payload fragment and the digest of the fourth sub-fragment are equal, deleting the fifth payload fragment from the fifth packet to generate a sixth packet, where the sixth packet includes a sixth packet header and a sixth payload, the sixth packet header and the fifth packet header are the same, and the sixth payload includes the fingerprint of the first sub-fragment and the fingerprint of the fourth sub-fragment.

Optionally, the sixth payload further includes position information of the first sub-fragment in the fifth packet and position information of the fourth sub-fragment in the fifth packet.

The fourth sub-fragment, similar to the first sub-fragment, is a data block with smaller granularity than the second fragment, so as to further improve data compression efficiency. The position information of the first sub-fragment in the fifth packet may be an offset of the highest bit of the first sub-fragment relative to a highest bit of the packet header of the fifth packet.

Optionally, the data processing method provided by the embodiment of the present invention may further include:

determining the end position of the third fragment through the delimitation algorithm, which includes:

sliding a third sliding window in the delimitation algorithm backwards from the second bit, and determining whether data corresponding to the third sliding window meets a delimitation condition in the delimitation algorithm; when it occurs for the first time that data corresponding to the third sliding window meets the delimitation condition, continuing to slide the third sliding window backwards within a first distance, and determining whether data corresponding to the third sliding window meets the delimitation condition; if a situation, where first data corresponding to the third sliding window meets the delimitation condition, occurs, determining that an end position of the first data is the end position of the third fragment, where a length of the third sliding window and the length of the first sliding window are the same, and a length of the first distance and the length of the first sliding window are the same.

Figure 3:
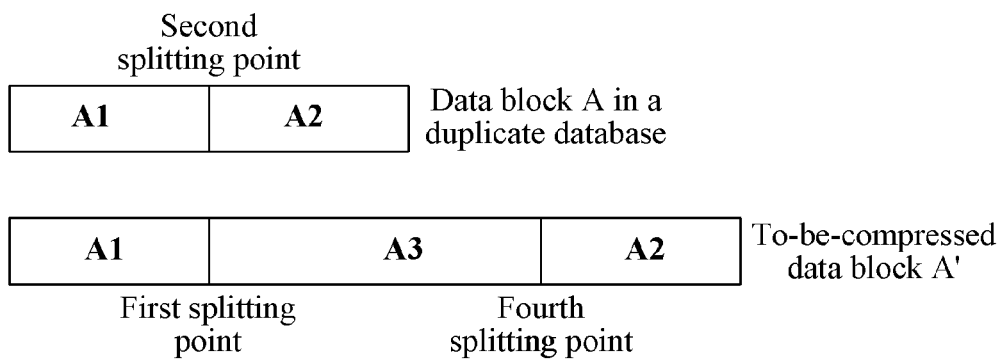
FIG. 3 is a schematic diagram of another application scenario of a data processing method provided by an embodiment of the present invention.

As shown in FIG. 3, the upper level data block A', to which the to-be-compressed data block belongs, and the corresponding data block A in the duplicate data block are different in digest content, which may be understood as that the previously sent data block A is modified and changes into the data block A', and is sent again. In this way, the data block A stored in the duplicate database when data is sent previously corresponds to the data block A' in data currently sent. Specifically, when a sliding window slides to the data block A', a fingerprint is calculated; if a same fingerprint exists in the duplicate database, it indicates that a corresponding data block exists in the duplicate database, where the corresponding data block is A.

The upper level data block A', to which the to-be-compressed data block belongs, may be determined through sliding-window delimitation.

A digest of the data block A' is calculated and compared with a digest of the data block A. Obviously, the digest of the data block A' and the digest of the data block A are different, because the content of the data block A and the content of the data block A' are different.

Then, a part in the data block A' being the same as a part in the data block A, and a part in the data block A' being different from a part in the data block A are found, and further compression processing is performed.

Specifically, the data block A' is compared with the data block A byte by byte; when the corresponding data block A in the duplicate database reaches the second splitting point, and the to-be-compressed data block A' reaches the first splitting point, a comparison result of the two indicates inconsistency. In this case, a sliding window is slid to the second splitting point to calculate a fingerprint, and in the upper level data block A', a sliding window is slid to the first splitting point to calculate a fingerprint, which is compared with the fingerprint at the second splitting point; if the two fingerprints are inconsistent, the sliding window continues to be slid backwards, a fingerprint behind the first splitting point is calculated, and continues to be compared with the fingerprint at the second splitting point; if the two fingerprints are inconsistent, the sliding window continues to be slid backwards until a calculated fingerprint is consistent with the fingerprint at the second splitting point or until the sliding window slides to an end boundary of the data block A'.

In this embodiment, a fingerprint at a fourth splitting point of the data block A' is consistent with the fingerprint at the second splitting point of the data block A in the duplicate database.

When the fingerprint at the fourth splitting point of the data block A' is consistent with the fingerprint at the second splitting point of the data block A, a digest from the fourth splitting point to a boundary is calculated, a digest from the second splitting point to a boundary of the data block A in the duplicate database is calculated, and the two calculated digests are compared; when the two calculated digests are inconsistent, according to the aforementioned operation, a byte behind the fourth splitting point and a byte behind the first splitting point are compared until a calculated fingerprint and the fingerprint at the second splitting point are consistent or until the sliding window slides to the end boundary of the data block A'; when the two calculated digests are consistent, the upper level data block A' is split into three sub-data blocks A1, A3 and A2 by the first splitting point and the fourth splitting point, and the data block A in the duplicate database is split into two sub-data blocks A1 and A2 by the second splitting point. It can be seen that, for the currently sent data block A', compared with the previously sent data block A, the sub-data block A3 is added, and the other two sub-data blocks A1 and A2 are unchanged, so that A1 or A2 may be replaced with a fingerprint, so as to realize precise compression of data, thereby increasing data compression efficiency. The sub-data block A2 in the to-be-compressed data block A' is the aforementioned fourth sub-fragment. An initial block of the sub-data block A2 in the to-be-compressed data block A' is a data block that starts from a first bit of the sub-data block A2 in the to-be-compressed data block A' and has a length of the first sliding window, that is, the first detected block in the fourth sub-fragment.

Replacing A1 or A2 may be implemented through other methods. For example, A1 or A2 may be replaced by using a fingerprint, a block length, and an offset value.

When the method of the embodiment shown in FIG. 1 is implemented by a decompression side device, the data processing method provided by the embodiment of the present invention may further include: synchronizing the fingerprint of the first sub-fragment and the digest of the first sub-fragment to a duplicate database at a compression side. After the duplicate database at the compression side is synchronized, a compression side device may use an existing CDC algorithm to perform de-duplication processing on a packet, that is, perform compression processing on data in the packet. In this way, when the packet includes the first sub-fragment, the first sub-fragment is deleted, thereby further improving data compression efficiency.

When the method of the embodiment shown in FIG. 1 is implemented by a compression side device, the data processing method provided by the embodiment of the present invention may further include: synchronizing the first sub-fragment, the fingerprint of the first sub-fragment, and the digest of the first sub-fragment to a duplicate database at a decompression side. In this way, after the first sub-fragment in a subsequent packet is deleted, a decompression side device can restore compressed data by using the first sub-fragment stored in the duplicate database, thereby realizing decompression.

Optionally, when the duplicate database at the compression side and the duplicate database at decompression side both include content of duplicate data, and the data processing method is implemented by the compression side device, the data processing method provided by the embodiment of the present invention may further include:

deleting the first sub-fragment from the to-be-compressed data, and adding the fingerprint of the first sub-fragment, the length of the first sub-fragment, and the position information of the first sub-fragment in the to-be-compressed data to a payload of a seventh packet, where the to-be-compressed data is the payload of the seventh packet.

The position information of the first sub-fragment in the to-be-compressed data may be an offset of the highest bit of the first sub-fragment relative to a highest bit of the to-be-compressed data. That is, after receiving the packet where the to-be-compressed data is, the compression side device can not only obtain the first sub-fragment by matching and create the first sub-fragment in a local duplicate database, but also can compress the to-be-compressed data and delete the first sub-fragment. The length of the first sub-fragment is added to the packet with redundancy removed, because the second fragment already exists in the duplicate database at the decompression side, and when the packet with redundancy removed is sent to the decompression side device, the decompression side device searches for the corresponding second fragment according to the fingerprint of the first sub-fragment therein, searches the second fragment for the first sub-fragment by using the length of the first sub-fragment and a position of the first sub-fragment in the to-be-compressed data, that is, an original position of the first sub-fragment in the packet before the compression, and restores the packet with redundancy removed, thereby realizing decompression.

Determining the end position of the third fragment through the delimitation algorithm may include:

sliding a third sliding window in the delimitation algorithm backwards from the second bit, and determining whether data corresponding to the third sliding window meets a delimitation condition in the delimitation algorithm; when it occurs for the first time that the data corresponding to the third sliding window meets the delimitation condition, continuing to slide the third sliding window backwards within a first distance, and determining whether the data corresponding to the third sliding window meets the delimitation condition; if a situation, where first data corresponding to the third sliding window meets the delimitation condition, occurs, determining that an end position of the first data is the end position of the third fragment, where a length of the third sliding window and the length of the first sliding window are the same, and a length of the first distance and the length of the first sliding window are the same.

For the delimitation algorithm, reference may be made to a delimitation algorithm in a CDC algorithm, and details are not repeated herein.

Specifically, the third sliding window is slid backwards from the second bit, and it is determined whether a fingerprint of data corresponding to the third sliding window meets the delimitation condition in the delimitation algorithm.

When it occurs for the first time that the data corresponding to the third sliding window meets the delimitation condition, the third sliding window continues to be slid backwards. That it occurs for the first time refers to that it is the first time that the data corresponding to the third sliding window meets the delimitation condition. The length of the third sliding window is equal to the length of the first sliding window. For example, the length of the third sliding window may be 64 bytes. In the delimitation algorithm, when the third sliding window slides backwards, a distance for each sliding may be 1 byte.

The third sliding window continues to be slid backwards within the first distance, and it is determined whether the data corresponding to the third sliding window meets the delimitation condition. If it occurs for multiple times within the first distance that first data corresponding to the third sliding window meets the delimitation condition, it may be determined that the first data that appears last time is a real boundary. That is to say, it may be determined that the end position of the first data that appears last time is the end position of the third fragment.

Figure 4:
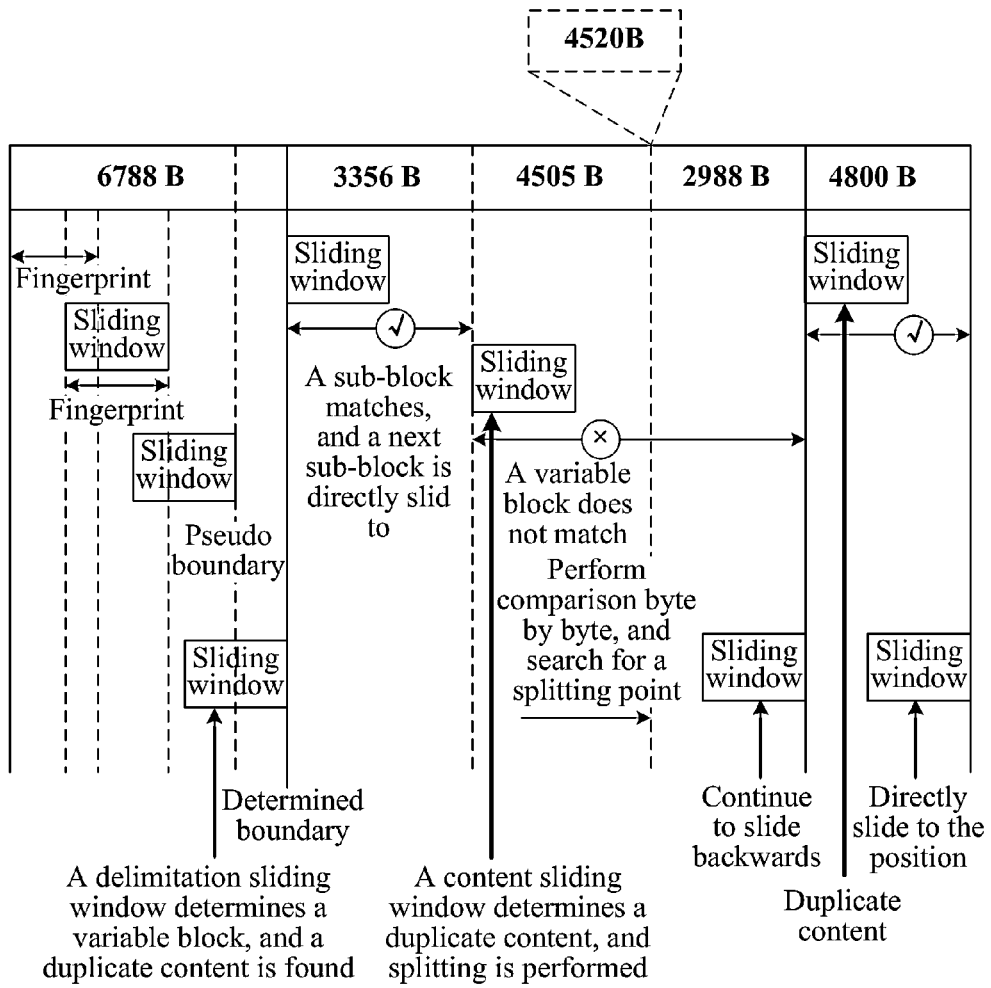
FIG. 4 is a schematic diagram of a specific implementation manner of a data processing method provided by an embodiment of the present invention.

FIG. 4 is a schematic diagram of a specific implementation manner of a data compression method provided by an embodiment of the present invention.

As shown in FIG. 4, packet data is divided into three blocks according to a delimitation principle of a CDC algorithm, where a middle big block is divided into three sub-blocks according to an optimization algorithm.

It is assumed that the packet data is sent for three times. When it is send for the first time, sub-blocks 3356B, 4505B, 4520B, and 2988B are sent as a data block, and stored in a duplicate database.

When it is sent for the second time, the data block is split into a first sub-block 3356B and a second sub-block, and the second sub-block is formed by sub-blocks 4505B, 4520B and 2988B. The first sub-block 3356B and the second sub-block are stored in the duplicate database.

When it is sent for the third time, the first sub-block 3356B becomes a data block 3356B, the sub-block 4520B is deleted from the second sub-block, and the sub-blocks 4505B and 2988B act as a data block assumed to be a data block C. In compression processing for this sending, the data block C needs to be split into the sub-block 4505B and the sub-block 2988B.

Specifically, when the data is sent for the third time, illustration is provided by taking an example that a data block 6788B, the data block 3356B, the data block C, and a data block 4800B are compressed.

Figure 5:
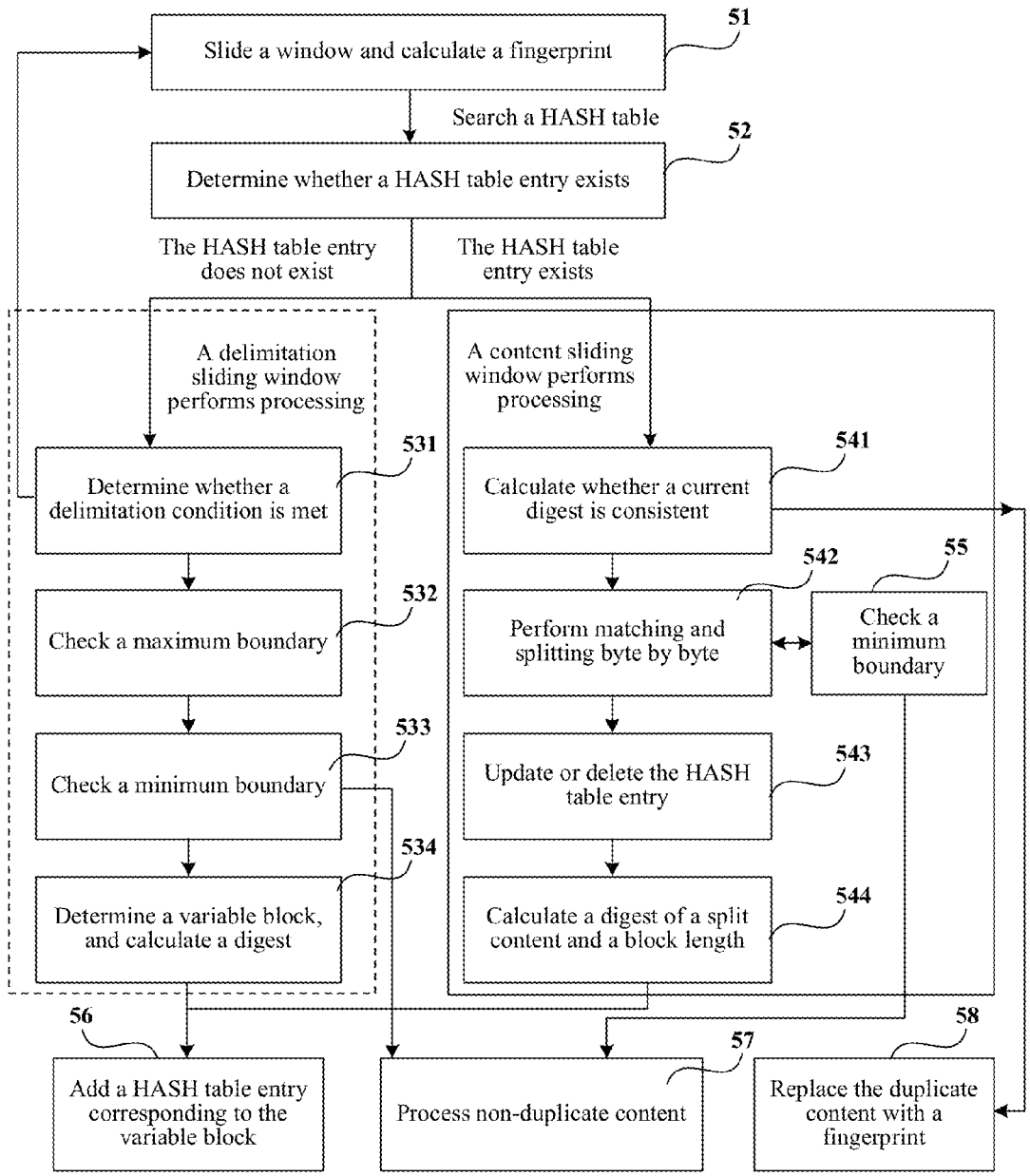
FIG. 5 is a flow chart of another data processing method provided by an embodiment of the present invention.

A compression operation is executed on the data block 6788B, the data block 3356B, the data block C, and the data block 4800B in FIG. 4, which may adopt a data processing method shown in FIG. 5. FIG. 5 is a flow chart of another data processing method provided by an embodiment of the present invention. The data processing method includes the following.

51: Slide a sliding window and calculate a fingerprint, where the sliding window herein is a content sliding window, in implementation, the content sliding window may be combined with a delimitation sliding window (that is, a sliding window in the prior art), that is, HASH computation is performed on data of a same length to obtain a fingerprint, but the content sliding window applies the fingerprint to determining whether the content of a data block is changed, and the delimitation sliding window applies the fingerprint to data block delimitation.

52: Determine whether a HASH table entry exists. Specifically, the fingerprint calculated by using the content sliding window is used as a searching key (KEY) to search a duplicate database, it is determined whether the HASH table entry exists in the duplicate database, and the HASH table entry includes the fingerprint obtained by calculation in aforementioned 51.

If the HASH table entry does not exist, it indicates that a data block corresponding to the fingerprint is content newly added this time, 531 is executed, and the newly added content is added to the duplicate database.

If the HASH table entry exists, it indicates that a data block corresponding to the fingerprint is stored in the duplicate database once, 541 is executed, block information in the HASH table entry is obtained, and current data is compared with the block information stored in the HASH table entry (key information is a block length and data obtained by an SHA-1/MD5 algorithm, that is a digest (checksum)). Of course, the block information may further include the original data content of the data block.

531: Determine whether the calculated fingerprint meets a delimitation condition. A similar sliding window in a CDC algorithm (called a delimitation sliding window) is adopted to perform block delimitation. A delimitation method is the same, that is, a fingerprint is calculated, it is determined according to the fingerprint whether the delimitation condition is met, and if yes, it is determined that a boundary of data is found.

A delimitation process of the CDC algorithm is slightly optimized herein, because it is possible that the content of this data block is changed, the content causes the delimitation condition to be met ahead of time, but change content is calculated into a next data block, which may result in that the next block cannot be determined as duplicate data (in fact this part is actually duplicate data). Therefore, it is considered that a boundary meeting the condition for the first time is a pseudo boundary, and at the moment sliding backwards for a distance is further performed (which may be called data disturbance); if it is found again that the delimitation condition is met, it is regarded that the latter is a real boundary (which may be called a determined boundary, the former being called a pseudo boundary); otherwise, the former is a real boundary (a determined boundary).

532: Check a maximum boundary. Normally, the length of the data block is limited within a range, and an upper limit may be preset, for example, a maximum length cannot exceed 64 Kbyte (byte). It is determined herein whether the length of the data block determined through aforementioned 531 exceeds the upper limit. If the upper limit is exceeded, the upper limit is used as the length of the data block, a boundary is forcibly determined at a byte of the sliding window in aforementioned 51 when a distance of the sliding window in aforementioned 51 is the upper limit, the data block undergoes new division, and then 534 is executed; if the length of the data block determined in 531 does not exceed the upper limit, 532 is executed.

533: Check a minimum boundary. Referring to aforementioned 532, normally not only an upper limit is preset to limit the maximum length that a data block may have, but also a lower limit is preset to limit a minimum length that a data block may have, for example, the minimum length cannot be smaller than 64 bytes. A length being smaller than the lower limit is regarded as fragmentary data and is not compressed, so as to prevent that a data block in a database is too fragmentary and occupies system resources to result in that a compression process makes no sense. If a byte is a block, it does not make any sense, but further wastes system resources.

If the length of the data block determined in 531 is greater than the lower limit, execute 534; if the length of the data block determined in 531 is smaller than the lower limit, execute 57.

534: Determine a variable block, calculate a digest, and then execute 56.

541: Calculate whether a current digest is consistent.

Specifically, a digest of a current data block is calculated and is compared with a digest in the duplicate database. It is determined whether they are consistent; if yes, execute 58; otherwise, execute 542.

Specifically, a data block, to which bytes corresponding to the sliding window of aforementioned step 51 belong, is directly determined by using a block length recorded by the HASH table entry in the duplicate database, and then a digest of the data block is calculated. Specifically, according to a block length value stored in the HASH table entry, a current block of current data, that is, a data block, to which bytes corresponding to the fingerprint belong, is located, and a checksum of the current block is calculated through algorithms such as SHA-1/MD5. The calculated checksum is compared with a checksum stored in the table entry. If they are the same, it is regarded that the current block is duplicate data, and the delimitation sliding window and the content sliding window are both made to directly skip the data block found this time to perform delimitation and content comparison of a next block. For the data block 3356B in FIG. 4, according to the aforementioned method, the block found this time is actually a duplicate block, so that the content sliding window is first slid to the next data block C, and it is checked whether a corresponding fingerprint thereof exists in the duplicate database, that is, a content sliding window fingerprint is used as a searching KEY to search the duplicate database for the HASH table entry. After the HASH table entry is found, a checksum of the data block C is calculated by using a block length in the table entry, and is compared with a checksum in the table entry. When it is checked that the currently calculated checksum and the checksum stored in the table entry are inconsistent, it indicates that the data block C is different from the content of a corresponding data block in the duplicate database, and 542 is executed to split the data block C and the corresponding data block in the duplicate database.

542: Perform matching and splitting byte by byte, and for each sub-data block obtained by splitting, execute 55; after splitting is completed, for all sub-data blocks obtained by splitting and meeting the length requirement of the data block, execute 543. All blocks resulting from the splitting process need to be checked, and no matter the part that matches or the part that does not match, what is smaller than the minimum boundary is regarded as fragmentary data. Any new block resulting from the splitting process involves update/deletion of a table entry, which is completed in the splitting process.

Specifically, matching is performed backwards byte by byte from an initial part of a current block until a byte different from that in the duplicate database is found, and the current block is split at the different byte. Further, a sliding window is used to check whether a fingerprint that is behind the splitting point and is the same as a subsequent fingerprint of the current block exists; if yes, check parts of the two that completely match, which are used as a new block and stored in the duplicate database. This process mainly identifies a situation where a small part is deleted from original data.

543: Update or delete the HASH table entry.

544: Calculate a split digest and a block length, and execute 56.

55: Perform minimum-boundary checking on a sub-data block; if a length of the sub-data block is greater than the lower limit, execute 543 for the sub-data block; if the length of the sub-data block is smaller than the lower limit, execute 57 for the sub-data block. 55 may be executed during execution of 542, that is, each time some data is obtained by splitting in 542, 55 is executed, and minimum-boundary checking is performed, so that after the splitting is completed, the minimum-boundary checking is completely performed on all sub-data blocks obtained by splitting, and 543 is executed for all data blocks that are obtained by splitting and have the lengths greater than the lower limit. Alternatively, 55 may also be executed between 542 and 543, that is, first 542 completes splitting of the data block, then 55 is executed, 55 is executed for all sub-data blocks obtained by splitting, and then 57 or 543 is executed for a judgment result of 55.

56: Add a HASH table entry corresponding to the variable block.

Specifically, in the duplicate database, the content of the data block is added, and the HASH table entry is added, that is, the duplicate database is updated, and the current data block is compressed.

57: Process non-duplicate content. Specifically, non-block content, that is, the aforementioned fragmentary data with the length smaller than the lower limit, is process separately. The data is kept in the packet and is not compressed, processing of a byte within the current sliding window is performed, and the sliding window continues to be slid backwards.

58: The content is completely duplicate content, the duplicate content is replaced with a fingerprint, and the current data block is deleted. After the splitting of the current block is completed, the content sliding window continues to be slid, the content of a subsequent data block is checked, and subsequent data of the current block is processed.

In the aforementioned procedure, the delimitation sliding window and the content sliding window may be the same sliding window, but data block delimitation and searching and comparison of the block content in the duplicate database are performed according to a calculation result (the fingerprint), so that the process of the compression method is divided into a delimitation sliding window process and a content sliding window process. A final processing result has three situations: one is that the original data block is split, and the duplicate database is updated; another is that data fails to match block content and does not meet a condition of being added to the duplicate database (for example, the length is too small), and the data is regarded as non-duplicate content and is directly placed in the packet; another result is that duplicate data is found, and in this case, a fingerprint representing the duplicate data and related information are placed in a certain format in the packet, and sent to a peer device.

Figure 6:
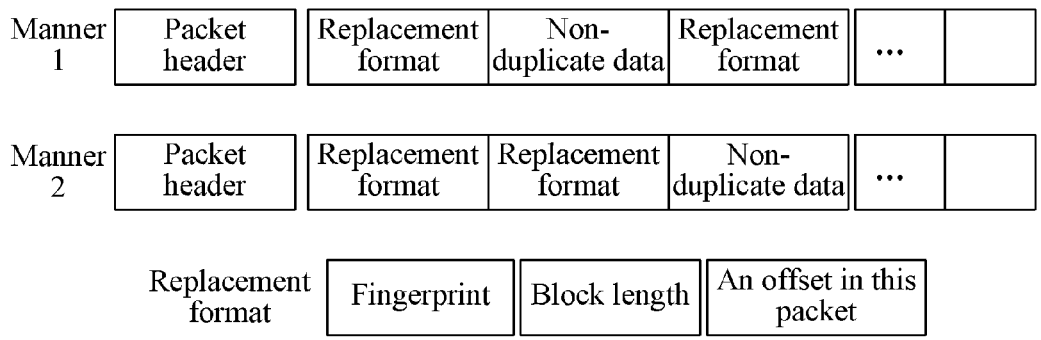
FIG. 6 is a schematic diagram of an encapsulation format of a compressed packet in a data processing method provided by an embodiment of the present invention.

Optionally, an encapsulation format of a compressed packet is shown in FIG. 6. In a manner 1, a position of non-duplicate data is not changed, but data blocks before and after the non-duplicate data are regarded as duplicate data and replaced. In a manner 2, a position of a replacement format in a compressed packet is designated. The replacement format includes a fingerprint, a block length, and an offset of a replaced data block in this packet.

For the specific application to the data block 6788B, first, when the sliding window slides to an initial part of the data block 6788B, the operation of aforementioned 51 is executed, a fingerprint of the initial part is calculated, then 52 is executed, it is determined whether a HASH table entry including the fingerprint exists in the duplicate database, the data block 6788B in this embodiment is a duplicate data block, and therefore, 541 is executed, a digest of the data block 6788B is calculate and is compared with a digest stored in the HASH table entry in the duplicate database, it is determined whether the two digests are consistent, a determination result in this embodiment indicates that the two digests are consistent, that is, the content part is a duplicate part, 58 is executed, the content of the data block 6788B in the data is deleted and is replaced with a fingerprint, and processing of the data block 6788B is completed.

Then, the sliding window slides to an initial part of the data block 3356B, 51 is executed, and a fingerprint of the initial part is calculated; 52 is executed, the duplicate database is searched for a corresponding HASH table entry, and block information such as a block length of the data block 3356B is obtained. 541 is executed, a digest of the data block 3356B is calculated, and is consistent with a digest in the HASH table entry of the duplicate data block, which indicates that the content of the data block 3356B and the content of a data block of the corresponding HASH table entry in the duplicate database are completely duplicate content, 58 is executed, the content of the data block 3356B in the data is deleted and replaced with a fingerprint, and processing of the data block 3356B is completed.

Then, the sliding window slides to an initial part of the data block C, 51 is executed, a fingerprint of the initial part is calculated; 52 is executed, the duplicate database is searched, and it is determined whether a HASH table entry including the fingerprint exists. In this embodiment, the HASH table entry of the data block C exists in the duplicate database. Then, 541 is executed, the data block C is delimited according to a block length in the found HASH table entry, a digest of the data block C is calculated, and it is determined whether the calculated digest is consistent with a digest in the HASH table entry. In this embodiment, the digest of the data block C is inconsistent with the digest in the HASH table entry, and then 542 is executed. Starting from the initial part of the data block C, it is compared backwards byte by byte with data block content corresponding to the HASH table entry until different bytes are found, and the data block C and the data block corresponding to the HASH table entry in the duplicate database are split at this position, that is, the different bytes. In this embodiment, the data block C is split into the sub-block 4505B and the sub-block 2988B. The sub-block 4505B is duplicate data of the data in the duplicate database. However, because a sub-block 4520B between the sub-block 4505B and the sub-block 2988B is deleted from the data block C sent this time, the content of the data block C and the content in the duplicate database do not match. Then, 543 is executed, the parts 4505B and 2988B obtained by splitting are both regarded as a new data block and stored in the duplicate database, a new HASH table entry is generated to replace the HASH table entry previously found. Correspondingly, if 4520B in the duplicate database meets a data block length requirement, 4520B is stored as a new data block; otherwise, 4520B is deleted. Then, 544 is executed, and block lengths and digests of the sub-block 4505B and the sub-block 2988B are calculated, and added to the new HASH table entry so as to be used to delete the data content of data blocks 4505B and 2988B during next data sending, and to perform replacement, thereby improving data compression efficiency.

For the to-be-compressed data, the sliding window continues to be slid backwards to an initial part of the data block 4800B, 51 is executed, and a fingerprint of the initial part is calculated. 52 is executed, the duplicate database is searched for a corresponding HASH table entry, and block information, such as the block length, of the data block 4800B is obtained. 541 is executed, a digest of the data block 4,800B is calculated, and is consistent with a digest in the HASH table entry of the duplicate data block, which indicates that the content of the data block 4,800B and the content of a data block of the corresponding HASH table entry in the duplicate database are completely duplicate content, 58 is executed, the content of the data block 4,800B in the data is deleted and replaced with a fingerprint, and processing of the data block 4,800B is completed.

After the data is compressed according to the aforementioned method, the compression side device, for example a WOC, sends the packet to the decompression side device.

Figure 7:
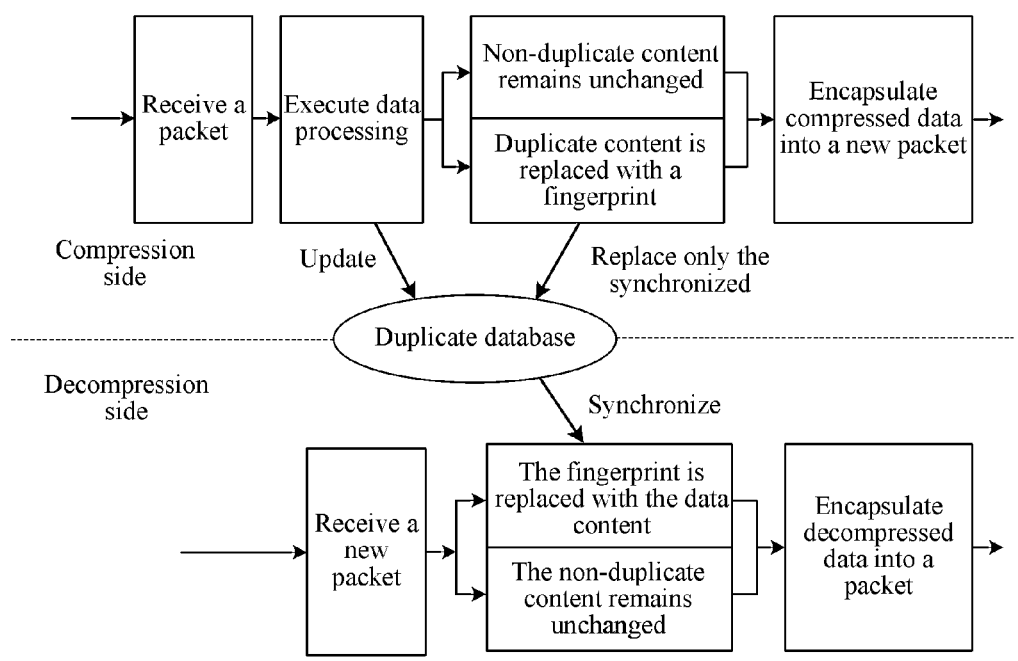
FIG. 7 is a schematic diagram of applying a data processing method provided by an embodiment of the present invention to a data compression side device.

As shown in FIG. 7, after receiving the packet, the compression side device parses the received packet to obtain the payload of the packet. The data in the payload is compressed according to the data processing method provided by the embodiment of the present invention. The compressed data is encapsulated into a new packet. The new packet is sent to the decompression side device.

After receiving the new packet, the decompression side device compresses a payload in the new packet by using the duplicate database. Specifically, a replacement format or a fingerprint in the packet may be deleted, the replacement format or the fingerprint may be replaced with a data block corresponding to the replacement format or the fingerprint, and the decompressed data may be encapsulated into a packet.

Generating the duplicate database (that is, the above algorithm process) may be only completed at a device of one end, then data (a fingerprint and/or data content of a duplicate data block) is synchronized to a peer. When data traffic is mainly downlink, that is, flowing from a server side to a user side (for example, a user downloads a file), the algorithm may be implemented in a WOC device close to the user side, and the content of the duplicate data block is stored, but a WOC device close to the server side only needs to synchronize fingerprint information, does not need to cache all of the content; otherwise, the algorithm is processed and the content is stored at a WOC device on the server side. Of course, the two sides both may calculate and store the content, but resource demands are increased.

Figure 8:
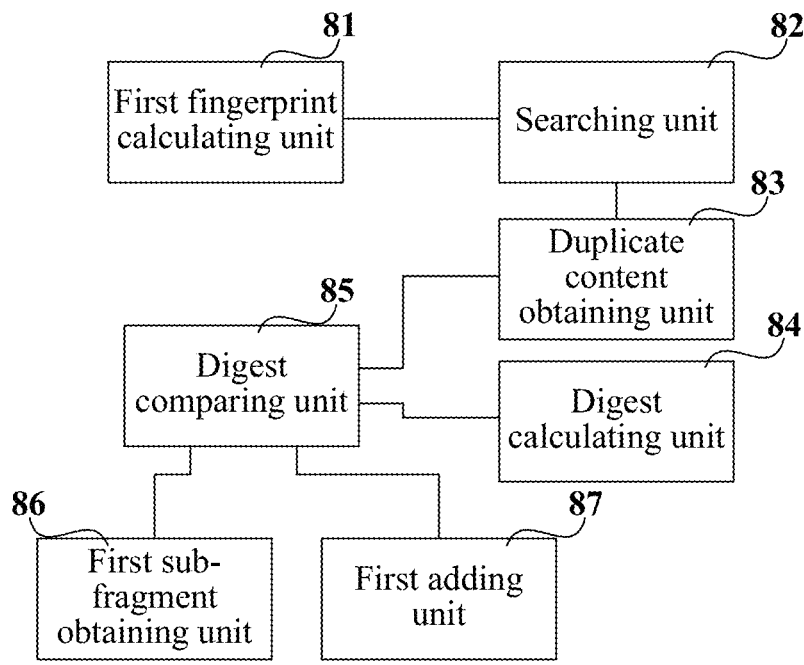
FIG. 8 is a schematic structural diagram of a data compression device provided by an embodiment of the present invention.

FIG. 8 is a schematic structural diagram of a data compression device provided by an embodiment of the present invention. The data compression device provided by this embodiment is configured to implement the methods of the embodiments shown in FIG. 1 and FIG. 5. As shown in FIG. 8, a data processing device includes: a first fingerprint calculating unit 81, a searching unit 82, a duplicate content obtaining unit 83, a digest calculating unit 84, a digest comparing unit 85, a first sub-fragment obtaining unit 86, and a first adding unit 87.

The first fingerprint calculating unit 81 is configured to, according to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same.

The searching unit 82 is configured to search a first local duplicate database for the first fingerprint, where the first local duplicate database is used to store duplicate data, a fingerprint of the duplicate data, and a digest of the duplicate data.

The duplicate content obtaining unit 83 is configured to, if the first fingerprint exists in the first local duplicate database, obtain, according to the first fingerprint, a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm.

The digest calculating unit 84 is configured to, according to the digest algorithm, calculate a digest of a second fragment in the to-be-compressed data, where a starting position of the second fragment and the starting position of the to-be-compressed data are the same, and a length of the second fragment and a length of the first variable block are the same.

The digest comparing unit 85 is configured to compare the digest of the second fragment with the digest of the first variable block.

The first sub-fragment obtaining unit 86 is configured to, if the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block.

The first adding unit 87 is configured to add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

The data compression device provided by the embodiment of the present invention may further include:

a first packet receiving unit, configured to receive a first packet, where the first packet includes a first packet header and a first payload, the first payload includes a first payload fragment, and a length of the first payload fragment and a length of the first sub-fragment are the same;

a second initial fingerprint calculating unit, configured to, according to the fingerprint algorithm, calculate a fingerprint of a second initial block in the first payload fragment, where a starting position of the second initial block and a starting position of the first payload fragment are the same, and a length of the second initial block and the length of the first sliding window are the same;

a first payload digest calculating unit, configured to, according to the digest algorithm, calculate a digest of the first payload fragment; and a second packet generating unit, configured to, if the fingerprint of the second initial block and the fingerprint of the first sub-fragment in the second local duplicate database are equal, and the digest of the first payload fragment and the digest of the first sub-fragment are equal, delete the first payload fragment from the first packet to generate a second packet, where the second packet includes a second packet header and a second payload, the second packet header and the first packet header are the same, and the second payload includes the fingerprint of the first sub-fragment.

The second payload may further include position information of the first sub-fragment in the first packet. The position information of the first sub-fragment in the first packet may be an offset of a highest bit of the first sub-fragment relative to a highest bit of the packet header of the first packet.

The data compression device provided by the embodiment of the present invention may further include:

a third initial fingerprint calculating unit, configured to, according to the fingerprint algorithm, calculate a fingerprint of a third initial block of a second sub-fragment in the to-be-compressed data, where a starting position of the second sub-fragment is the second bit, an end position of the second sub-fragment and an end position of the to-be-compressed data are the same; a starting position of the third initial block is the second bit, and a length of the third initial block is equal to the length of the first sliding window;

a detected-block obtaining unit, configured to, according to a second sliding window, obtain a first detected block in a second sub-variable block, where a starting position of the second sliding window corresponds to a third bit in the second sub-variable block, the third bit is a bit between a starting position of the second sub-variable block and an end position of the second sub-variable block, a length of the second sliding window is equal to the length of the first sliding window, the starting position of the second sub-variable block is the first bit, and the end position of the second sub-variable block and an end position of the first variable block are the same;

a detected-block fingerprint calculating unit, configured to, according to the fingerprint algorithm, calculate a fingerprint of the first detected block;

a fingerprint comparing unit, configured to compare the fingerprint of the third initial block with the fingerprint of the first detected block;

a third digest comparing unit, configured to, if the fingerprint of the third initial block and the fingerprint of the first detected block are the same, compare a digest of a third sub-variable block in the second sub-variable block with a digest of a third sub-fragment in the second sub-fragment, where a starting position of the third sub-variable block and a starting position of the first detected block are the same, an end position of the third sub-variable block and the end position of the first variable block are the same, a starting position of the third sub-fragment and the starting position of the second sub-fragment are the same, a length of the third sub-fragment and a length of the third sub-variable block are equal, and the digest of the third sub-variable block is obtained by calculating the digest of the third sub-variable block according to the digest algorithm; and a third adding unit, configured to, if the digest of the third sub-fragment and the digest of the third sub-variable block are equal, add the third sub-fragment, a fingerprint of the third sub-fragment, and the digest of the third sub-fragment to the second local duplicate database to generate a third local duplicate database, where the fingerprint of the third sub-fragment is equal to the fingerprint of the third initial block, and the digest of the third sub-fragment is obtained by calculating the digest of the third sub-fragment according to the digest algorithm.

The data compression device provided by the embodiment of the present invention may further include:

a third packet receiving unit, configured to receive a third packet, where the third packet includes a third packet header and a third payload, the third payload includes a second payload fragment and a third payload fragment, a length of the second payload fragment and the length of the first sub-fragment are the same, and a length of the third payload fragment and the length of the third sub-fragment are the same;

a fourth initial fingerprint calculating unit, configured to, according to the fingerprint algorithm, calculate a fingerprint of a fourth initial block in the second payload fragment, and according to the fingerprint algorithm, calculate a fingerprint of a fifth initial block in the third payload fragment, where a starting position of the fourth initial block and a starting position of the second payload fragment are the same, a length of the fourth initial block and the length of the first sliding window are the same, a starting position of the fifth initial block and a starting position of the third payload fragment are the same, and a length of the fifth initial block and the length of the first sliding window are the same;

a third payload digest calculating unit, configured to, according to the digest algorithm, calculate a digest of the second payload fragment, and according to the digest algorithm, calculate a digest of the third payload fragment; and a fourth packet generating unit, configured to, if a fingerprint of the fourth initial block and the fingerprint of the first sub-fragment in the third local duplicate database are equal, and the digest of the second payload fragment and the digest of the first sub-fragment are equal, delete the second payload fragment from the third packet; if a fingerprint of the fifth initial block and the fingerprint of the third sub-fragment in the third local duplicate database are equal, and the digest of the third payload fragment and the digest of the third sub-fragment are equal, delete the third payload fragment from the third packet to generate a fourth packet, where the fourth packet includes a fourth packet header and a fourth payload, the fourth packet header and the third packet header are the same, and the fourth payload includes the fingerprint of the first sub-fragment and the fingerprint of the third sub-fragment.

The fourth payload further includes position information of the first sub-fragment in the third packet and position information of the third sub-fragment in the third packet. The position information of the first sub-fragment in the third packet may be an offset of the highest bit of the first sub-fragment relative to a highest bit of the packet header of the third packet.

The data compression device provided by the embodiment of the present invention may further include:

an initial block fingerprint calculating unit, configured to, according to the fingerprint algorithm, calculate a fingerprint of a sixth initial block of a fourth sub-variable block in the first variable block, where a starting position of the fourth sub-variable block is the first bit, an end position of the fourth sub-variable block and the end position of the first variable block are the same, a starting position of the sixth initial block is the first bit, and a length of the sixth initial block is equal to the length of the first sliding window;

a detected-block obtaining unit, configured to obtain a second detected block in a fourth sub-fragment, where a starting position of the second detected block corresponds to a fourth bit in the fourth sub-fragment, the fourth bit is a bit between a starting position of a third fragment and an end position of the third fragment, a length of the second detected block is equal to the length of the first sliding window, a starting position of the third fragment is the second bit, an end position of the third fragment is determined through a delimitation algorithm, the third fragment is a fragment in the to-be-compressed data, the fourth sub-fragment is a sub-fragment in the third fragment, a starting position of the fourth sub-fragment and the starting position of the second detected block are the same, and a length of the fourth sub-fragment and a length of the fourth sub-variable block are the same;

a detected-block fingerprint calculating unit, configured to, according to the fingerprint algorithm, calculate a fingerprint of the second detected block;

a fingerprint comparing unit, configured to compare the fingerprint of the sixth initial block with the fingerprint of the second detected block;

a fourth digest comparing unit, configured to, if the fingerprint of the sixth initial block and the fingerprint of the second detected block are the same, compare a digest of the fourth sub-variable block and a digest of the fourth sub-fragment, where the digest of the fourth sub-variable block is obtained by calculating the digest of the fourth sub-variable block according to the digest algorithm, and the digest of the fourth sub-fragment is obtained by calculating the digest of the fourth sub-fragment according to the digest algorithm; and a fourth adding unit, configured to, if the digest of the fourth sub-fragment and the digest of the fourth sub-variable block are the same, add the fourth sub-fragment, a fingerprint of the fourth sub-fragment, and the digest of the fourth sub-fragment to the second local duplicate database to generate a fourth local duplicate database, where the fingerprint of the fourth sub-fragment and the fingerprint of the sixth initial block are the same.

The data compression device provided by the embodiment of the present invention may further include:

a fifth packet receiving unit, configured to receive a fifth packet, where the fifth packet includes a fifth packet header and a fifth payload, the fifth payload includes a fourth payload fragment and a fifth payload fragment, a length of the fourth payload fragment and the length of the first sub-fragment are the same, a length of the fifth payload fragment and the length of the fourth sub-fragment are the same;

a seventh initial fingerprint calculating unit, configured to, according to the fingerprint algorithm, calculate a fingerprint of a seventh initial block in the fourth payload fragment, and according to the fingerprint algorithm, calculate a fingerprint of an eighth initial block in the fifth payload fragment, where a starting position of the seventh initial block and a starting position of the fourth payload fragment are the same, a length of the seventh initial block and the length of the first sliding window are the same, a starting position of the eighth initial block and a starting position of the fifth payload fragment are the same, and a length of the eighth initial block and the length of the first sliding window are the same;

a fifth payload digest calculating unit, configured to, according to the digest algorithm, calculate a digest of the fourth payload fragment, and according to the digest algorithm, calculate a digest of the fifth payload fragment; and a sixth packet generating unit, configured to, if the fingerprint of the seventh initial block and the fingerprint of the first sub-fragment in the fourth local duplicate database are equal, and the digest of the fourth payload fragment and the digest of the first sub-fragment are equal, delete the fourth payload fragment from the fifth packet; if the fingerprint of the eighth initial block and the fingerprint of the fourth sub-fragment in the fourth local duplicate database are equal, and the digest of the fifth payload fragment and the digest of the fourth sub-fragment are equal, delete the fifth payload fragment from the fifth packet to generate a sixth packet, where the sixth packet includes a sixth packet header and a sixth payload, the sixth packet header and the fifth packet header are the same, and the sixth payload includes the fingerprint of the first sub-fragment and the fingerprint of the fourth sub-fragment.

The sixth payload may further include position information of the first sub-fragment in the fifth packet and position information of the fourth sub-fragment in the fifth packet. The position information of the first sub-fragment in the fifth packet may be an offset of the highest bit of the first sub-fragment relative to a highest bit of the packet header of the fifth packet.

Optionally, the detected-block obtaining unit slide a third sliding window in the delimitation algorithm backwards from the second bit, and determine whether data corresponding to the third sliding window meets a delimitation condition in the delimitation algorithm; when it occurs for the first time that data corresponding to the third sliding window meets the delimitation condition, continue to slide the third sliding window backwards within a first distance, and determine whether data corresponding to the third sliding window meets the delimitation condition; if a situation, where first data corresponding to the third sliding window meets the delimitation condition, occurs, determine that an end position of the first data is the end position of the third fragment, where a length of the third sliding window and the length of the first sliding window are the same, and a length of the first distance and the length of the first sliding window are the same.

The data compression device provided by the embodiment of the present invention may further include:

a second synchronization unit, configured to synchronize the first sub-fragment, the fingerprint of the first sub-fragment, and the digest of the first sub-fragment to a duplicate database at a decompression side.

The data compression device provided by the embodiment of the present invention may further include:

a compression processing unit, configured to delete the first sub-fragment from the to-be-compressed data, and add the fingerprint of the first sub-fragment, the length of the first sub-fragment, and the position information of the first sub-fragment in the to-be-compressed data to a payload of a seventh packet, where the to-be-compressed data is the payload of the seventh packet.

The position information of the first sub-fragment in the to-be-compressed data may be an offset of the highest bit of the first sub-fragment relative to a highest bit of the to-be-compressed data.

The data compression device provided by the embodiment of the present invention may be a WOC. It should be understood by persons skilled in the art that, in addition to the aforementioned functional units, the WOC shall further have basic functional units for packet receiving, network connection and so on, which are not repeated herein.

A data decompression device provided by an embodiment of the present invention includes:

a first fingerprint calculating unit, configured to, according to a fingerprint algorithm, calculate a first fingerprint of a first fragment in to-be-compressed data, where a starting position of the first fragment and a starting position of the to-be-compressed data are the same, and a length of the first fragment and a length of a first sliding window are the same;

a searching unit, configured to search a first local duplicate database for the first fingerprint, where the first local duplicate database is used to store duplicate data, a fingerprint of the duplicate data, and a digest of the duplicate data;

a duplicate content obtaining unit, configured to, if the first fingerprint exists in the first local duplicate database, according to the first fingerprint, obtain a first variable block and a digest of the first variable block which are in the first local duplicate database, where the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm;

a digest calculating unit, configured to, according to the digest algorithm, calculate a digest of a second fragment in the to-be-compressed data, where a starting position of the second fragment and the starting position of the to-be-compressed data are the same, and a length of the second fragment and a length of the first variable block are the same;

a digest comparing unit, configured to compare the digest of the second fragment with the digest of the first variable block;

a first sub-fragment obtaining unit, configured to, if the digest of the second fragment and the digest of the first variable block are different, obtain a first sub-fragment in the second fragment, where the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and a first adding unit, configured to add the first sub-fragment, a fingerprint of the first sub-fragment, and a digest of the first sub-fragment to the first local duplicate database to generate a second local duplicate database, where the fingerprint of the first sub-fragment and the first fingerprint are the same, and the digest of the first sub-fragment is obtained by calculating the digest of the first sub-fragment according to the digest algorithm.

It should be understood by persons skilled in the art that, in addition to the aforementioned units, the data decompression device provided by the embodiment of the present invention further has basic functional units for decompression and so on.

The data decompression device provided by the embodiment of the present invention may further include:

a first synchronization unit, configured to synchronize the fingerprint of the first sub-fragment and the digest of the first sub-fragment to a duplicate database at a compression side.

Figure 9:
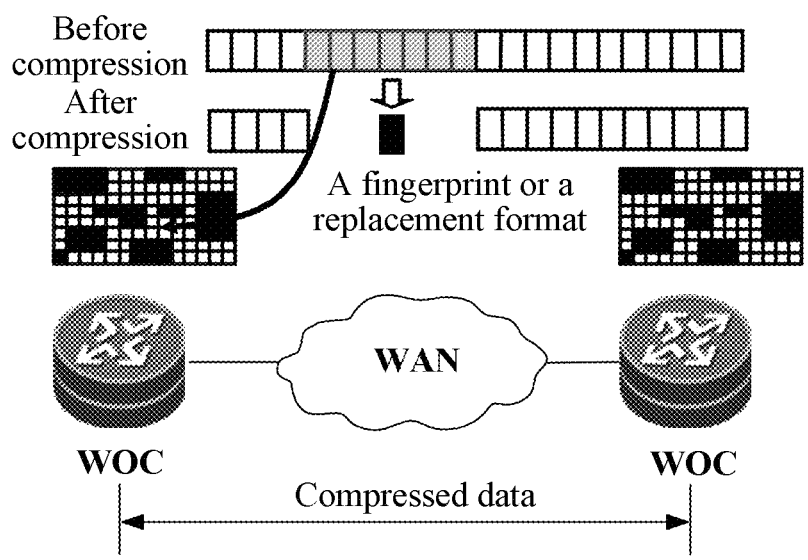
FIG. 9 is a networking structure diagram of an application scenario of a data compression device provided by an embodiment of the present invention.

FIG. 9 is a networking structure diagram of an application scenario of a data compression method provided by an embodiment of the present invention. As shown in FIG. 9, each of the devices for compressing data and decompressing data at two ends of a WAN is a WOC. That is to way, the WOC may have both functions of compressing data and decompressing data.

Figure 10:
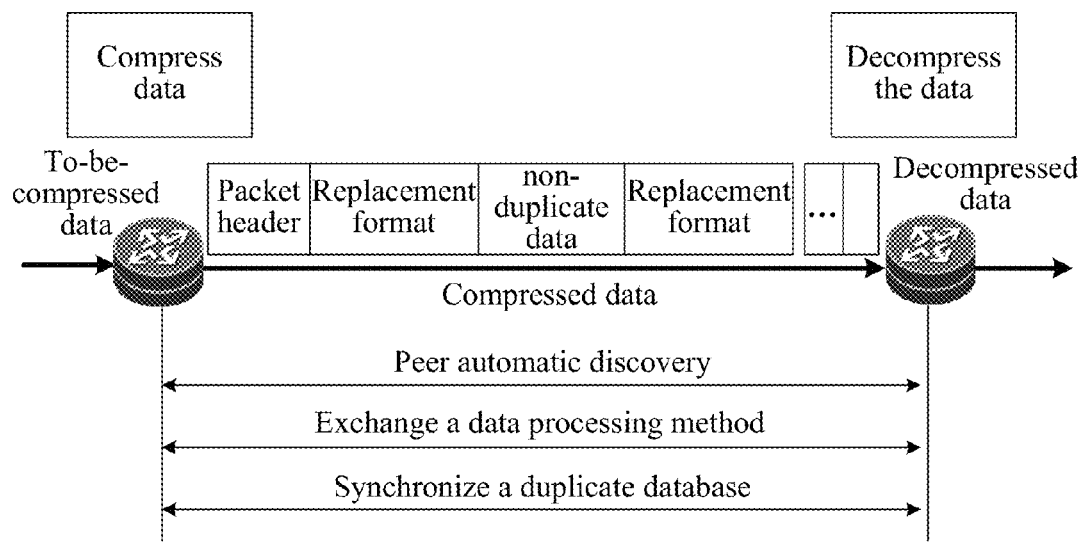
FIG. 10 is a networking structure diagram of another application scenario of a data compression device provided by an embodiment of the present invention.

FIG. 10 is a networking structure diagram of another application scenario of a data compression method provided by an embodiment of the present invention. As shown in FIG. 10, interaction between WOC devices at two ends includes two levels, namely, a control level and a data level.

On the control level, devices at two ends need to exchange control information through a proprietary protocol, a peer device is automatically discovered, a response is sent to an upstream device through a downstream device, and the upstream device may sense existence and address information (for example, an IP address) of the downstream device. Further, the devices at two ends need to notify each other of adopted algorithm information and reach an agreement (for example, they both adopt MD5 to calculate a content checksum) with each other, and further need to synchronize information in a duplicate database, which includes a fingerprint and an information table entry corresponding to the fingerprint (such as a block length and a checksum value). A synchronization process is regular synchronization and incremental synchronization. Regular synchronization refers to that consistency check is performed on all duplicate database content regularly. However, for the incremental synchronization, only the specific block information that is newly added or updated/deleted is notified to the peer end.

The data level refers to that algorithm processing and data replacement are performed on service data passing through the devices at two ends, so as to decrease the length and number of packets, thereby achieving the objective of data compression.

According to the technical solutions provided by the embodiment of the present invention, if to-be-compressed data includes a data fragment that is the same as a first half of a variable block in a duplicate database and is different from a second half of the variable block, a new variable block with granularity smaller than that of the matching variable block can be generated, and the new variable block is added to the duplicate database.

Compared with the method for directly searching for a located block, the granularity of the new variable block is smaller. Therefore, the technical solutions provided by the embodiment of the present invention increase the probability of subsequent to-be-compressed data matching the updated duplicate database, thereby improving compression efficiency.

A person of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for the detailed working processes of the foregoing system, apparatus, and unit, reference may be made to the corresponding processes in the foregoing method embodiments, and the details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such understanding, the technical solutions of the present invention essentially, or the part contributing to the prior art, or part of the technical solutions may be implemented in a form of a software product. The computer software product is stored in a storage medium, and includes several instructions for instructing a computer device (which may be a personal computer, a server, or a network device) to perform all or a part of the steps of the methods described in the embodiments of the present invention. The storage medium includes: any medium that can store program codes, such as a USB flash disk, a removable hard disk, a read-only memory (Read-Only Memory, ROM), a random access memory (Random Access Memory), a magnetic disk, or an optical disk.

The foregoing description is merely about specific embodiments of the present invention, but is not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A data processing method, comprising: according to a fingerprint algorithm, calculating a first fingerprint of a first fragment in to-be-compressed data, wherein a starting position of the first fragment and a starting position of the to-be-compressed data are the same, and a length of the first fragment and a length of a first sliding window are the same;
   searching a first local duplicate database for the first fingerprint, wherein the first local duplicate database is used to store duplicate data, a fingerprint of the duplicate data, and a digest of the duplicate data;
   in response to determining that the first fingerprint exists in the first local duplicate database, according to the first fingerprint, obtaining a first variable block and a digest of the first variable block which are in the first local duplicate database, wherein the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm; according to the digest algorithm, calculating a digest of a second fragment in the to-be-compressed data, wherein a starting position of the second fragment and the starting position of the to-be-compressed data are the same, and a length of the second fragment and a length of the first variable block are the same;
   comparing the digest of the second fragment with the digest of the first variable block;
   in response to determining that the digest of the second fragment and the digest of the first variable block are different, obtaining a first sub-fragment in the second fragment, wherein the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and
   adding the first sub-fragment, a fingerprint of the first sub-fragment, and a digest of the first sub-fragment to the first local duplicate database to generate a second local duplicate database, wherein the fingerprint of the first sub-fragment and the first fingerprint are the same, and the digest of the first sub-fragment is obtained by calculating the digest of the first sub-fragment according to the digest algorithm.

2. The method according to claim 1, further comprising:
   receiving a first packet, wherein the first packet comprises a first packet header and a first payload, the first payload comprises a first payload fragment, and a length of the first payload fragment and a length of the first sub-fragment are the same;
   according to the fingerprint algorithm, calculating a fingerprint of a second initial block in the first payload fragment, wherein a starting position of the second initial block and a starting position of the first payload fragment are the same, and
   a length of the second initial block and the length of the first sliding window are the same; according to the digest algorithm, calculating a digest of the first payload fragment; and
   in response to determining that the fingerprint of the second initial block and the fingerprint of the first sub-fragment in the second local duplicate database are equal, and the digest of the first payload fragment and the digest of the first sub-fragment are equal, deleting the first payload fragment from the first packet to generate a second packet, wherein the second packet comprises a second packet header and a second payload, the second packet header and the first packet header are the same, and the second payload comprises the fingerprint of the first sub-fragment.

3. The method according to claim 2, wherein the second payload further comprises position information of the first sub-fragment in the first packet.

4. The method according to claim 1, wherein after the obtaining a first sub-fragment in the second fragment, the method further comprises:
according to the fingerprint algorithm, calculating a fingerprint of a third initial block of a second sub-fragment in the to-be-compressed data, wherein a starting position of the second sub-fragment is the second bit, an end position of the second sub-fragment and an end position of the to-be-compressed data are the same;
a starting position of the third initial block is the second bit, and a length of the third initial block is equal to the length of the first sliding window; according to a second sliding window, obtaining a first detected block in a second sub-variable block, wherein a starting position of the second sliding window corresponds to a third bit in the second sub-variable block, the third bit is a bit between a starting position of the second sub-variable block and an end position of the second sub-variable block, a length of the second sliding window is equal to the length of the first sliding window, the starting position of the second sub-variable block is the first bit, and the end position of the second sub-variable block and an end position of the first variable block are the same;
according to the fingerprint algorithm, calculating a fingerprint of the first detected block; comparing the fingerprint of the third initial block with the fingerprint of the first detected block;
in response to determining that the fingerprint of the third initial block and the fingerprint of the first detected block are the same, comparing a digest of a third sub-variable block in the second sub-variable block with a digest of a third sub-fragment in the second sub-fragment, wherein a starting position of the third sub-variable block and a starting position of the first detected block are the same, an end position of the third sub-variable block and the end position of the first variable block are the same, a starting position of the third sub-fragment and the starting position of the second sub-fragment are the same, a length of the third sub-fragment and a length of the third sub-variable block are equal, and the digest of the third sub-variable block is obtained by calculating the digest of the third sub-variable block according to the digest algorithm; and
in response to determining that the digest of the third sub-fragment and the digest of the third sub-variable block are equal, adding the third sub-fragment, a fingerprint of the third sub-fragment, and the digest of the third sub-fragment to the second local duplicate database to generate a third local duplicate database, wherein the fingerprint of the third sub-fragment is equal to the fingerprint of the third initial block, and the digest of the third sub-fragment is obtained by calculating the digest of the third sub-fragment according to the digest algorithm.

5. The method according to claim 4, further comprising:
receiving a third packet, wherein the third packet comprises a third packet header and a third payload, the third payload comprises a second payload fragment and a third payload fragment, a length of the second payload fragment and the length of the first sub-fragment are the same, and a length of the third payload fragment and the length of the third sub-fragment are the same;
according to the fingerprint algorithm, calculating a fingerprint of a fourth initial block in the second payload fragment, and according to the fingerprint algorithm, calculating a fingerprint of a fifth initial block in the third payload fragment, wherein a starting position of the fourth initial block and a starting position of the second payload fragment are the same, a length of the fourth initial block and the length of the first sliding window are the same, a starting position of the fifth initial block and a starting position of the third payload fragment are the same, and a length of the fifth initial block and the length of the first sliding window are the same; according to the digest algorithm, calculating a digest of the second payload fragment, and according to the digest algorithm, calculating a digest of the third payload fragment; and
in response to determining that a fingerprint of the fourth initial block and the fingerprint of the first sub-fragment in the third local duplicate database are equal, and the digest of the second payload fragment and the digest of the first sub-fragment are equal, deleting the second payload fragment from the third packet; if a fingerprint of the fifth initial block and the fingerprint of the third sub-fragment in the third local duplicate database are equal, and the digest of the third payload fragment and the digest of the third sub-fragment are equal, deleting the third payload fragment from the third packet to generate a fourth packet, wherein the fourth packet comprises a fourth packet header and a fourth payload, the fourth packet header and the third packet header are the same, and the fourth payload comprises the fingerprint of the first sub-fragment and the fingerprint of the third sub-fragment.

6. The method according to claim 4, wherein the fourth payload further comprises position information of the first sub-fragment in the third packet and position information of the third sub-fragment in the third packet.

7. The method according to claim 1, further comprising:
according to the fingerprint algorithm, calculating a fingerprint of a sixth initial block of a fourth sub-variable block in the first variable block, wherein a starting position of the fourth sub-variable block is the first bit, an end position of the fourth sub-variable block and the end position of the first variable block are the same, a starting position of the sixth initial block is the first bit, and a length of the sixth initial block is equal to the length of the first sliding window;
obtaining a second detected block in a fourth sub-fragment, wherein a starting position of the second detected block corresponds to a fourth bit in the fourth sub-fragment, the fourth bit is a bit between a starting position of a third fragment and an end position of the third fragment, a length of the second detected block is equal to the length of the first sliding window, a starting position of the third fragment is the second bit, an end position of the third fragment is determined through a delimitation algorithm, the third fragment is a fragment in the to-be-compressed data, the fourth sub-fragment is a sub-fragment in the third fragment, a starting position of the fourth sub-fragment and the starting position of the second detected block are the same, and a length of the fourth sub-fragment and a length of the fourth sub-variable block are the same; according to the fingerprint algorithm, calculating a fingerprint of the second detected block;

comparing the fingerprint of the sixth initial block with the fingerprint of the second detected block;

in response to determining that the fingerprint of the sixth initial block and the fingerprint of the second detected block are the same, comparing a digest of the fourth sub-variable block and a digest of the fourth sub-fragment, wherein the digest of the fourth sub-variable block is obtained by calculating the digest of the fourth sub-variable block according to the digest algorithm, and the digest of the fourth sub-fragment is obtained by calculating the digest of the fourth sub-fragment according to the digest algorithm; and in response to determining that the digest of the fourth sub-fragment and the digest of the fourth sub-variable block are the same, adding the fourth sub-fragment, a fingerprint of the fourth sub-fragment, and the digest of the fourth sub-fragment to the second local duplicate database to generate a fourth local duplicate database, wherein the fingerprint of the fourth sub-fragment and the fingerprint of the sixth initial block are the same.

8. The method according to claim 7, further comprising:
receiving a fifth packet, wherein the fifth packet comprises a fifth packet header and a fifth payload, the fifth payload comprises a fourth payload fragment and a fifth payload fragment, a length of the fourth payload fragment and the length of the first sub-fragment are the same, a length of the fifth payload fragment and the length of the fourth sub-fragment are the same; according to the fingerprint algorithm, calculating a fingerprint of a seventh initial block in the fourth payload fragment, and according to the fingerprint algorithm, calculating a fingerprint of an eighth initial block in the fifth payload fragment, wherein a starting position of the seventh initial block and a starting position of the fourth payload fragment are the same, a length of the seventh initial block and the length of the first sliding window are the same, a starting position of the eighth initial block and a starting position of the fifth payload fragment are the same, and a length of the eighth initial block and the length of the first sliding window are the same; according to the digest algorithm, calculating a digest of the fourth payload fragment, and according to the digest algorithm, calculating a digest of the fifth payload fragment; and in response to determining that the fingerprint of the seventh initial block and the fingerprint of the first sub-fragment in the fourth local duplicate database are equal, and the digest of the fourth payload fragment and the digest of the first sub-fragment are equal, deleting the fourth payload fragment from the fifth packet;

in response to determining that the fingerprint of the eighth initial block and the fingerprint of the fourth sub-fragment in the fourth local duplicate database are equal, and the digest of the fifth payload fragment and the digest of the fourth sub-fragment are equal, deleting the fifth payload fragment from the fifth packet to generate a sixth packet, wherein the sixth packet comprises a sixth packet header and a sixth payload, the sixth packet header and the fifth packet header are the same, and the sixth payload comprises the fingerprint of the first sub-fragment and the fingerprint of the fourth sub-fragment.

9. The method according to claim 8, wherein the sixth payload further comprises position information of the first sub-fragment in the fifth packet and position information of the fourth sub-fragment in the fifth packet.

10. The method according to claim 7, wherein that an end position of the third fragment is determined through a delimitation algorithm comprises: sliding a third sliding window in the delimitation algorithm backwards from the second bit, and determining whether data corresponding to the third sliding window meets a delimitation condition in the delimitation algorithm; when it occurs for the first time that data corresponding to the third sliding window meets the delimitation condition, continuing to slide the third sliding window backwards within a first distance, and determining whether data corresponding to the third sliding window meets the delimitation condition;

in response to determining that a situation, in which first data corresponding to the third sliding window meets the delimitation condition, occurs, determining that an end position of the first data is the end position of the third fragment, wherein a length of the third sliding window and the length of the first sliding window are the same, and a length of the first distance and the length of the first sliding window are the same.

11. The method according to claim 1, further comprising: synchronizing the fingerprint of the first sub-fragment and the digest of the first sub-fragment to a duplicate database at a compression side.

12. The method according to claim 1, further comprising: synchronizing the first sub-fragment, the fingerprint of the first sub-fragment, and the digest of the first sub-fragment to a duplicate database at a decompression side.

13. The method according to claim 1, further comprising:
deleting the first sub-fragment from the to-be-compressed data, and adding the fingerprint of the first sub-fragment, the length of the first sub-fragment, and the position information of the first sub-fragment in the to-be-compressed data to a payload of a seventh packet, wherein the to-be-compressed data is the payload of the seventh packet.

14. A data compression device, comprising: a first fingerprint calculating unit, configured to, according to a fingerprint algorithm, calculate a first fingerprint of a first fragment in to-be-compressed data, wherein a starting position of the first fragment and a starting position of the to-be-compressed data are the same, and a length of the first fragment and a length of a first sliding window are the same; a searching unit, configured to search a first local duplicate database for the first fingerprint, wherein the first local duplicate database is used to store duplicate data, a fingerprint of the duplicate data, and a digest of the duplicate data; a duplicate content obtaining unit, configured to, in response to determining that the first fingerprint exists in the first local duplicate database, according to the first fingerprint, obtain a first variable block and a digest of the first variable block which are in the first local duplicate database, wherein the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm; a digest calculating unit, configured to, according to the digest algorithm, calculate a digest of a second fragment in the to-be-compressed data, wherein a starting position of the second fragment and the starting position of the to-be-compressed data are the same, and a length of the second fragment and a length of the first variable block are the same; a digest comparing unit, configured to compare the digest of the second fragment with the digest of the first variable block; a first sub-fragment obtaining unit, configured to,
in response to determining that the digest of the second fragment and the digest of the first variable block are different, obtain a first sub-fragment in the second fragment, wherein the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and a first adding unit, configured to add the first sub-fragment, a fingerprint of the first sub-fragment, and a digest of the first sub-fragment to the first local duplicate database to generate a second local duplicate database, wherein the fingerprint of the first sub-fragment and the first fingerprint are the same, and the digest of the first sub-fragment is obtained by calculating the digest of the first sub-fragment according to the digest algorithm.

15. The device according to claim 14, further comprising: a first packet receiving unit, configured to receive a first packet, wherein the first packet comprises a first packet header and a first payload, the first payload comprises a first payload fragment, and a length of the first payload fragment and a length of the first sub-fragment are the same; a second initial fingerprint calculating unit, configured to, according to the fingerprint algorithm, calculate a fingerprint of a second initial block in the first payload fragment, wherein a starting position of the second initial block and a starting position of the first payload fragment are the same, and a length of the second initial block and the length of the first sliding window are the same; a first payload digest calculating unit, configured to, according to the digest algorithm, calculate a digest of the first payload fragment; and a second packet generating unit, configured to,
in response to determining that the fingerprint of the second initial block and the fingerprint of the first sub-fragment in the second local duplicate database are equal, and the digest of the first payload fragment and the digest of the first sub-fragment are equal, delete the first payload fragment from the first packet to generate a second packet, wherein the second packet comprises a second packet header and a second payload, the second packet header and the first packet header are the same, and the second payload comprises the fingerprint of the first sub-fragment.

16. The device according to claim 15, wherein the second payload further comprises position information of the first sub-fragment in the first packet.

17. The device according to claim 14, further comprising: a third initial fingerprint calculating unit, configured to, according to the fingerprint algorithm, calculate a fingerprint of a third initial block of a second sub-fragment in the to-be-compressed data, wherein a starting position of the second sub-fragment is the second bit, an end position of the second sub-fragment and an end position of the to-be-compressed data are the same; a starting position of the third initial block is the second bit, and a length of the third initial block is equal to the length of the first sliding window; a detected-block obtaining unit, configured to, according to a second sliding window, obtain a first detected block in a second sub-variable block, wherein a starting position of the second sliding window corresponds to a third bit in the second sub-variable block, the third bit is a bit between a starting position of the second sub-variable block and an end position of the second sub-variable block, a length of the second sliding window is equal to the length of the first sliding window, the starting position of the second sub-variable block is the first bit, and the end position of the second sub-variable block and an end position of the first variable block are the same; a detected-block fingerprint calculating unit, configured to, according to the fingerprint algorithm, calculate a fingerprint of the first detected block; a fingerprint comparing unit, configured to compare the fingerprint of the third initial block with the fingerprint of the first detected block; a third digest comparing unit, configured to,
in response to determining that the fingerprint of the third initial block and the fingerprint of the first detected block are the same, compare a digest of a third sub-variable block in the second sub-variable block with a digest of a third sub-fragment in the second sub-fragment, wherein a starting position of the third sub-variable block and a starting position of the first detected block are the same, an end position of the third sub-variable block and the end position of the first variable block are the same, a starting position of the third sub-fragment and the starting position of the second sub-fragment are the same, a length of the third sub-fragment and a length of the third sub-variable block are equal, and the digest of the third sub-variable block is obtained by calculating the digest of the third sub-variable block according to the digest algorithm; and a third adding unit, configured to,
in response to determining that the digest of the third sub-fragment and the digest of the third sub-variable block are equal, add the third sub-fragment, a fingerprint of the third sub-fragment, and the digest of the third sub-fragment to the second local duplicate database to generate a third local duplicate database, wherein the fingerprint of the third sub-fragment is equal to the fingerprint of the third initial block, and the digest of the third sub-fragment is obtained by calculating the digest of the third sub-fragment according to the digest algorithm.

18. The device according to claim 17, further comprising: a third packet receiving unit, configured to receive a third packet, wherein the third packet comprises a third packet header and a third payload, the third payload comprises a second payload fragment and a third payload fragment, a length of the second payload fragment and the length of the first sub-fragment are the same, and a length of the third payload fragment and the length of the third sub-fragment are the same; a fourth initial fingerprint calculating unit, configured to, according to the fingerprint algorithm, calculate a fingerprint of a fourth initial block in the second payload fragment, and according to the fingerprint algorithm, calculate a fingerprint of a fifth initial block in the third payload fragment, wherein a starting position of the fourth initial block and a starting position of the second payload fragment are the same, a length of the fourth initial block and the length of the first sliding window are the same, a starting position of the fifth initial block and a starting position of the third payload fragment are the same, and a length of the fifth initial block and the length of the first sliding window are the same; a third payload digest calculating unit, configured to, according to the digest algorithm, calculate a digest of the second payload fragment, and according to the digest algorithm, calculate a digest of the third payload fragment; and a fourth packet generating unit, configured to, in response to determining that a fingerprint of the fourth initial block and the fingerprint of the first sub-fragment in the third local duplicate database are equal, and the digest of the second payload fragment and the digest of the first sub-fragment are equal, delete the second payload fragment from the third packet;

in response to determining that a fingerprint of the fifth initial block and the fingerprint of the third sub-fragment in the third local duplicate database are equal, and the digest of the third payload fragment and the digest of the third sub-fragment are equal, delete the third payload fragment from the third packet to generate a fourth packet, wherein the fourth packet comprises a fourth packet header and a fourth payload, the fourth packet header and the third packet header are the same, and the fourth payload comprises the fingerprint of the first sub-fragment and the fingerprint of the third sub-fragment.

19. The device according to claim 17, wherein the fourth payload further comprises position information of the first sub-fragment in the third packet and position information of the third sub-fragment in the third packet.

20. The device according to claim 14, further comprising: an initial block fingerprint calculating unit, configured to, according to the fingerprint algorithm, calculate a fingerprint of a sixth initial block of a fourth sub-variable block in the first variable block, wherein a starting position of the fourth sub-variable block is the first bit, an end position of the fourth sub-variable block and the end position of the first variable block are the same, a starting position of the sixth initial block is the first bit, and a length of the sixth initial block is equal to the length of the first sliding window; a detected-block obtaining unit, configured to obtain a second detected block in a fourth sub-fragment, wherein a starting position of the second detected block corresponds to a fourth bit in the fourth sub-fragment, the fourth bit is a bit between a starting position of a third fragment and an end position of the third fragment, a length of the second detected block is equal to the length of the first sliding window, a starting position of the third fragment is the second bit, an end position of the third fragment is determined through a delimitation algorithm, the third fragment is a fragment in the to-be-compressed data, the fourth sub-fragment is a sub-fragment in the third fragment, a starting position of the fourth sub-fragment and the starting position of the second detected block are the same, and a length of the fourth sub-fragment and a length of the fourth sub-variable block are the same; a detected-block fingerprint calculating unit, configured to, according to the fingerprint algorithm, calculate a fingerprint of the second detected block; a fingerprint comparing unit, configured to compare the fingerprint of the sixth initial block with the fingerprint of the second detected block; a fourth digest comparing unit, configured to, in response to determining that the fingerprint of the sixth initial block and the fingerprint of the second detected block are the same, compare a digest of the fourth sub-variable block and a digest of the fourth sub-fragment, wherein the digest of the fourth sub-variable block is obtained by calculating the digest of the fourth sub-variable block according to the digest algorithm, and the digest of the fourth sub-fragment is obtained by calculating the digest of the fourth sub-fragment according to the digest algorithm; and a fourth adding unit, configured to, in response to determining that the digest of the fourth sub-fragment and the digest of the fourth sub-variable block are the same, add the fourth sub-fragment, a fingerprint of the fourth sub-fragment, and the digest of the fourth sub-fragment to the second local duplicate database to generate a fourth local duplicate database, wherein the fingerprint of the fourth sub-fragment and the fingerprint of the sixth initial block are the same.

21. The device according to claim 20, further comprising: a fifth packet receiving unit, configured to receive a fifth packet, wherein the fifth packet comprises a fifth packet header and a fifth payload, the fifth payload comprises a fourth payload fragment and a fifth payload fragment, a length of the fourth payload fragment and the length of the first sub-fragment are the same, a length of the fifth payload fragment and the length of the fourth sub-fragment are the same; a seventh initial fingerprint calculating unit, configured to, according to the fingerprint algorithm, calculate a fingerprint of a seventh initial block in the fourth payload fragment, and according to the fingerprint algorithm, calculate a fingerprint of an eighth initial block in the fifth payload fragment, wherein a starting position of the seventh initial block and a starting position of the fourth payload fragment are the same, a length of the seventh initial block and the length of the first sliding window are the same, a starting position of the eighth initial block and a starting position of the fifth payload fragment are the same, and a length of the eighth initial block and the length of the first sliding window are the same; a fifth payload digest calculating unit, configured to, according to the digest algorithm, calculate a digest of the fourth payload fragment, and according to the digest algorithm, calculate a digest of the fifth payload fragment; and a sixth packet generating unit, configured to, in response to determining that the fingerprint of the seventh initial block and the fingerprint of the first sub-fragment in the fourth local duplicate database are equal, and the digest of the fourth payload fragment and the digest of the first sub-fragment are equal, delete the fourth payload fragment from the fifth packet;

in response to determining that the fingerprint of the eighth initial block and the fingerprint of the fourth sub-fragment in the fourth local duplicate database are equal, and the digest of the fifth payload fragment and the digest of the fourth sub-fragment are equal, delete the fifth payload fragment from the fifth packet to generate a sixth packet, wherein the sixth packet comprises a sixth packet header and a sixth payload, the sixth packet header and the fifth packet header are the same, and the sixth payload comprises the fingerprint of the first sub-fragment and the fingerprint of the fourth sub-fragment.

22. The device according to claim 21, wherein the sixth payload further comprises position information of the first sub-fragment in the fifth packet and position information of the fourth sub-fragment in the fifth packet.

23. The device according to claim 20, wherein the detected-block obtaining unit is specifically configured to, slide a third sliding window in the delimitation algorithm backwards from the second bit, and determine whether data corresponding to the third sliding window meets a delimitation condition in the delimitation algorithm;

when it occurs for the first time that data corresponding to the third sliding window meets the delimitation condition, continue to slide the third sliding window backwards within a first distance, and determine whether data corresponding to the third sliding window meets the delimitation condition;

in response to determining that a situation, in which first data corresponding to the third sliding window meets the delimitation condition, occurs, determine that an end position of the first data is the end position of the third fragment, wherein a length of the third sliding window and the length of the first sliding window are the same, and a length of the first distance and the length of the first sliding window are the same.

24. The device according to claim 14, further comprising:
a second synchronization unit, configured to synchronize the first sub-fragment, the fingerprint of the first sub-fragment, and the digest of the first sub-fragment to a duplicate database at a decompression side.

25. The device according to claim 14, further comprising:
a compression processing unit, configured to delete the first sub-fragment from the to-be-compressed data, and add the fingerprint of the first sub-fragment, the length of the first sub-fragment, and the position information of the first sub-fragment in the to-be-compressed data to a payload of a seventh packet, wherein the to-be-compressed data is the payload of the seventh packet.

26. A data decompression device, comprising: a first fingerprint calculating unit, configured to, according to a fingerprint algorithm, calculate a first fingerprint of a first fragment in to-be-compressed data, wherein a starting position of the first fragment and a starting position of the to-be-compressed data are the same, and a length of the first fragment and a length of a first sliding window are the same; a searching unit, configured to search a first local duplicate database for the first fingerprint, wherein the first local duplicate database is used to store duplicate data, a fingerprint of the duplicate data, and a digest of the duplicate data; a duplicate content obtaining unit, configured to, in response to determining that the first fingerprint exists in the first local duplicate database, according to the first fingerprint, obtain a first variable block and a digest of the first variable block which are in the first local duplicate database, wherein the first fingerprint and a fingerprint, obtained by calculating according to the fingerprint algorithm, of a first initial block in the first variable block are the same, a starting position of the first initial block and a starting position of the first variable block are the same, a length of the first initial block and the length of the first sliding window are the same, and the digest of the first variable block is obtained by calculating the digest of the first variable block according to a digest algorithm; a digest calculating unit, configured to, according to the digest algorithm, calculate a digest of a second fragment in the to-be-compressed data, wherein a starting position of the second fragment and the starting position of the to-be-compressed data are the same, and a length of the second fragment and a length of the first variable block are the same; a digest comparing unit, configured to compare the digest of the second fragment with the digest of the first variable block; a first sub-fragment obtaining unit, configured to, if in response to determining that the digest of the second fragment and the digest of the first variable block are different, obtain a first sub-fragment in the second fragment, wherein the first sub-fragment and a first sub-variable block in the first variable block are the same, a starting position of the first sub-fragment and the starting position of the second fragment are the same, a starting position of the first sub-variable block and the starting position of the first variable block are the same, a second bit in the second fragment and a first bit in the first variable block are different, the second bit is a bit following the first sub-fragment in the second fragment, and the first bit is a bit following the first sub-variable block in the first variable block; and a first adding unit, configured to add the first sub-fragment, a fingerprint of the first sub-fragment, and a digest of the first sub-fragment to the first local duplicate database to generate a second local duplicate database, wherein the fingerprint of the first sub-fragment and the first fingerprint are the same, and the digest of the first sub-fragment is obtained by calculating the digest of the first sub-fragment according to the digest algorithm.

27. The device according to claim 26, further comprising:
a first synchronization unit, configured to synchronize the fingerprint of the first sub-fragment and the digest of the first sub-fragment to a duplicate database at a compression side.

* * * * *